United States Patent [19]
Lysinger

[11] Patent Number: 5,783,958
[45] Date of Patent: Jul. 21, 1998

[54] SWITCHING MASTER SLAVE CIRCUIT

[75] Inventor: Mark A. Lysinger, Carrollton, Tex.

[73] Assignee: SGS-Thomson Microelectronics, Inc., Carrollton, Tex.

[21] Appl. No.: 588,648

[22] Filed: Jan. 19, 1996

[51] Int. Cl.$^6$ .................................................. H03K 3/289
[52] U.S. Cl. ........................ 327/202; 327/403; 327/407
[58] Field of Search .................................. 327/202, 403, 327/407

[56] References Cited

U.S. PATENT DOCUMENTS

| 5,124,951 | 6/1992 | Slemmer et al. | 365/230.06 |
| 5,261,064 | 11/1993 | Wyland | 395/400 |
| 5,319,759 | 6/1994 | Chan | 395/400 |
| 5,453,957 | 9/1995 | Norris et al. | 365/230.04 |
| 5,526,320 | 6/1996 | Zagar et al. | 365/233.5 |
| 5,572,536 | 11/1996 | Thiruvengadam | 327/202 |

OTHER PUBLICATIONS

I.B.M. Tech. Disc. Bul., vol. 26, No. 3A, "Effective master-slave latch combination" Clair, pp. 983–984, Aug. 1983.

Primary Examiner—Margaret Rose Wambach
Attorney, Agent, or Firm—David V. Carlson; Theodore E. Galanthay; Lisa K. Jorgenson

[57] ABSTRACT

A master-slave-master latch circuit for loading data vertically or horizontally. A first master latch is coupled to an input terminal for receiving data. Under control of a clock, the data is transferred from the master latch to a slave latch input terminal. Under control of the slave latch clock, the data is shifted horizontally into the slave latch. Under control of a further horizontal shift clock the data is shifted to a further master latch. The slave circuits are organized in a vertical column fashion so that data may be shifted vertically up or down the slave latches as provided from the master latch. Feedback circuits from the master latch to various positions within the slave latch column permit the data to be selectively transferred from one horizontal level to the prior horizontal level for placing in the vertical column. The horizontal and vertical master slave latch switching circuit can thus be operated as a number of logic elements, including a counter, shift register or other elements under the control of the master clocks.

18 Claims, 11 Drawing Sheets

5,783,958

SWITCHING MASTER SLAVE CIRCUIT

The following U.S. Pat. applications by David C. McClure entitled: "Architecture Redundancy," Ser. No. 08/582,424, and "Redundancy Control," Ser. No. 08/580,827, which were filed on Dec. 29, 1995, and have the same ownership as the present application, and to that extent are related to the present application, which are incorporated herein by reference; and entitled: "Test Mode Activation And Data Override," Ser. No. 08/587,709, "Pipelined Chip Enable Control Circuitry And Methodology," Ser. No. 08/588,730, "Output Driver Circuitry Having A Single Slew Rate Resistor," Ser. No. 08/588,988, "Synchronous Stress Test Control," Ser. No. 08/589,015, "Write Pass Through Circuit," Ser. No. 08/588,662, "Data-Input Device For Generating Test Signals On Bit And Bit-Complement Lines," Ser. No. 08/588,762, "Synchronous Output Circuit," Ser. No. 08/588,901, "Write Driver Having A Test Function," Ser. No. 08/589,141, "Circuit And Method For Tracking The Start Of A Write To A Memory Cell," Ser. No. 08/589,139, "Circuit And Method For Terminating A Write To A Memory Cell," Ser. No. 08/588,737, "Clocked Sense Amplifier With Word Line Tracking," Ser. No. 08/587,782, "Memory-Row Selector Having A Test Function," Ser. No. 08/589,140, "Synchronous Test Mode Initialization," Ser. No. 08/588,729, "Device And Method For Isolating Bit Lines From A Data Line," Ser. No. 08/588,740, "Circuit And Method For Setting The Time Duration Of A Write To A Memory Cell," Ser. No. 08/587,711, "Low-Power Read Circuit And Method For Controlling A Sense Amplifier," Ser. No. 08/589,024, "Device And Method For Driving A Conductive Path With A Signal," Ser. No. 08/587,708, and the following U.S. Pat. application by Mark A. Lysinger entitled: "Burst Counter Circuit And Method of Operation Thereof," Ser. No. 08/589,023, all of which have the same effective filing date and ownership as the present application, and to that extent are related to the present application, which are incorporated herein by reference.

1. Field of the Invention

This invention is related to a switching master slave circuit and more particularly to a master slave circuit which shifts data horizontally from master to slave and shifts data in a vertical shift register column from a second master latch back into a slave latch at the same level as the first slave latch.

2. Background of the Invention

As synchronous burst SRAMs become more popular, market pressure to improve performance is increased. Part of the increased performance has been obtained by pipelining data. While pipelining data increases the speed at which the data is provided to a user, it does not increase the speed of the cycle time nor shorten the overall time required to get data into or out of specific addresses within a memory array.

One known technique for increasing the speed at which data is read out of a memory is to use a burst counter which increments the input and memory address under the control of a clock without requiring new address to be input. Previous burst SRAMs used a burst counter which manipulated the address signal before it was input to the address decoder circuit. In the prior art, the output of the burst counter was then passed to an address decoder. This type of burst counter could also easily be attached to the front of existing synchronous designs with no significant changes required to the memory core or to the synchronous decoder. Using this technique, the memory could use well known and reliable decoder circuits to select the rows and columns.

One downside of this approach is that all address transitions must still propagate through the decoder. The speed at which address signals can propagate through the decoder may become a limiting factor in faster cycle times.

SUMMARY OF THE INVENTION

According to principles of the present invention, a switching master-slave-master latch circuit is provided. An input terminal for receiving input data is coupled to the input of a first master latch circuit. The first master latch circuit is controlled by a first clock for storing the data received from the input terminal. A slave latch circuit at a first level is coupled to the output of the first master latch, the slave latch storing slave data received from the master latch. The slave latch stores data under control of a second clock signal to transfer data from the master latch to the slave latch. The slave latch data is provided on the output of the slave latch. An operational logic circuit receives the data from the output terminal for performing a logical circuit operation based on the state of the data.

The output of the slave latch is also coupled to a second master latch. The second master latch receives the slave data and stores the state of the slave data under the control of a third clock signal.

The second master latch circuit provides an output signal which is fed back to slave latches of the same level as the first slave latch. Specifically, a plurality of slave latches are arranged in a first level, in what can be analogized to a vertical column. The output of the second master latch provides input data to another slave latch which is in the same vertical column as the first slave latch from which it received the data. On the same clock cycle, the first slave latch is receiving data from another master latch in the same vertical level as the second master latch. The slave latch remains operational for receiving additional data from the first master latch under control of the first clock in which could be analogized to a horizontal data transfer.

The master-slave-master combination is thus organized in a horizontal shift pattern and in a vertical shift pattern so that new data may be fed horizontally into any point of the master-slave-master circuit and then shifted vertically to various positions in the vertical column of slave circuits under control of a vertical column of master latch circuits.

One advantage of the present invention is that the master slave latch information may be shifted in both the horizontal direction and in a vertical direction. This permits the vertical column slave latch master latch combination to operate as a shift register, a counter, or other logical circuits for performing specific transfer operations in a first direction while being individually loaded with data from a second direction. The count function, shift register function, or other operation may thus be easily controlled to start at any specific point and continue in any desired pattern under control of the appropriate clock and shift cycles. As will be appreciated, separate clocks are provided for each latch state. A first clock is provided for the master latch. Three separate clocks are provided for the slave latch, one clock for latching data in the horizontal direction, another clock for latching data in the vertical up direction, and a third clock for latching data in the vertical down direction. The second master latch is clocked for receiving data in the horizontal direction from the slave latch and connected for transferring in the vertical direction to slave latches at different locations in the vertical column.

DETAILED DESCRIPTION OF THE INVENTION

Figure 1:
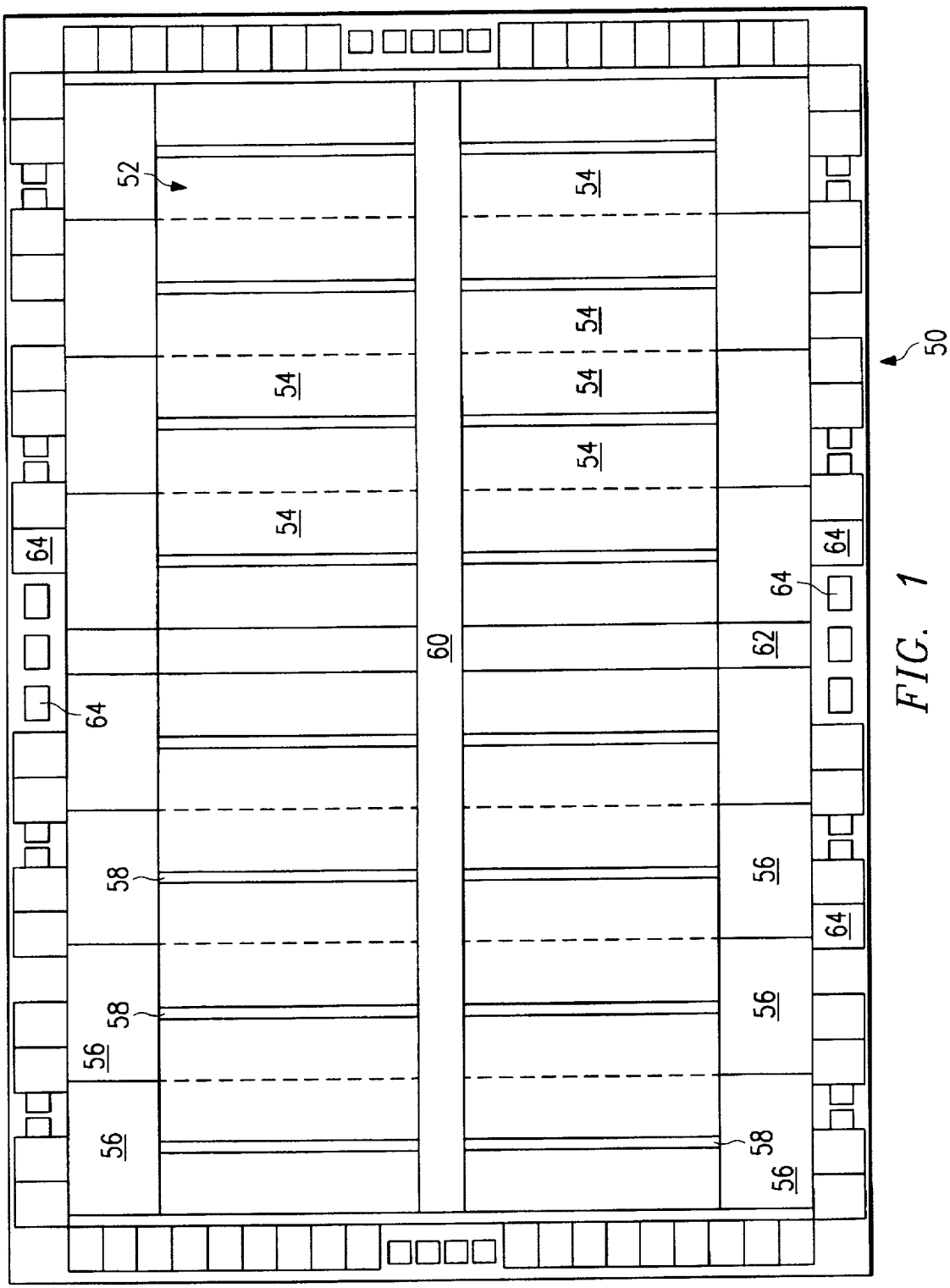
FIG. 1 is a memory device having a memory array thereon.

FIG. 1 shows a memory device 50 having a memory array 52 thereon. The memory array 52 is subdivided into a plurality of memory array blocks 54. The memory array is subdivided into as many memory array blocks as desired, according to the design. For example, eight blocks, nine blocks, or 16 blocks are rather common numbers of array blocks. In one embodiment, 32 memory array blocks 54 are formed, as is shown in FIG. 1. The 32 blocks are grouped into four quadrants; each quadrant having eight blocks. There are four quadrants on the memory device 50.

Associated with each memory array block 54 is the respective block input/output circuitry 56 and word line drive circuitry 58. In one embodiment, the word line drive circuitry 58 for two blocks of memory is positioned in a single region between the two adjacent memory blocks 54. Alternatively, it can be located in the central or peripheral regions of the device 50. Other circuitry for accessing the cells in the array, such as the row and address decoders, input/output buffers and sense amplifiers are located in the block I/O circuitry 56, the central regions 60 and 62 and other positions on the device 50 as needed. A plurality of bonding pads 64 are provided in the peripheral region of the chip for connecting to data input/output pins, voltage supply lines, address lines and other electrical connections as needed for the memory device 50.

Figure 2:
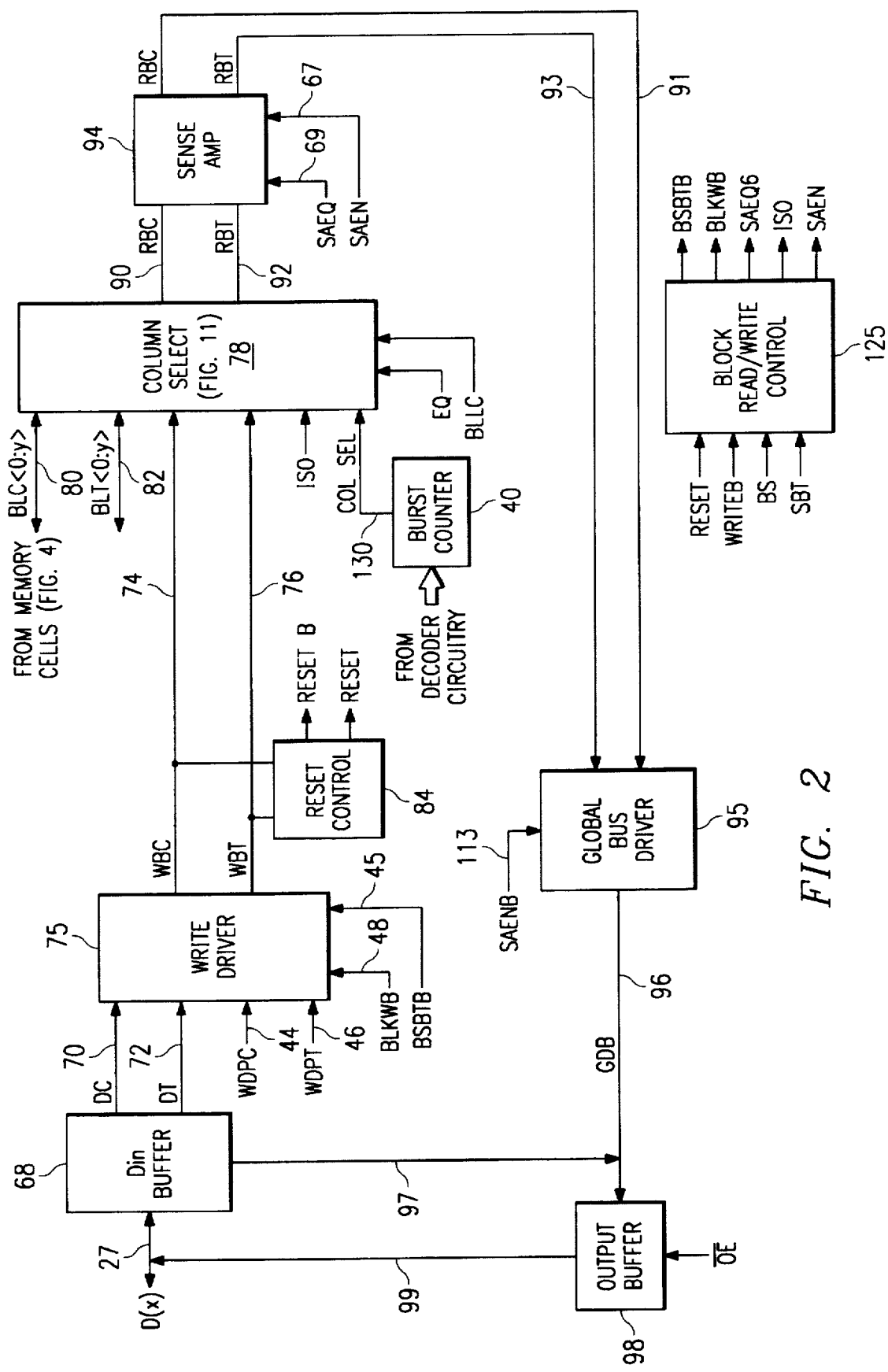
FIG. 2 is a block diagram of various circuits on the memory device of FIG. 1.
Figure 3:
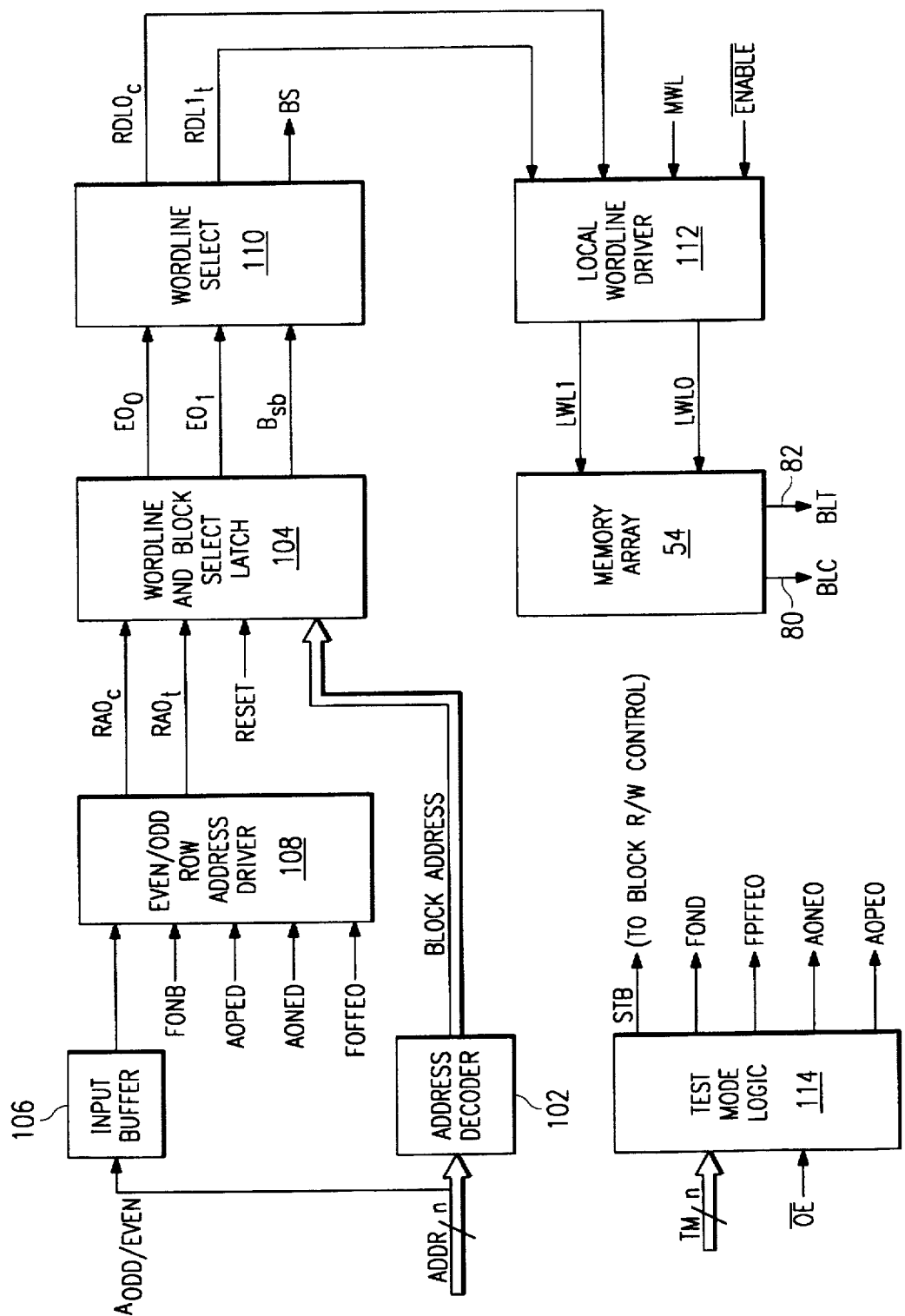
FIG. 3 is a block diagram of additional circuits on the device of FIG. 1.

FIGS. 2 and 3 illustrate block diagrams for various circuitry as found on the memory device 50. Each block of memory array 54 is provided with circuitry for providing data to and from for that individual block. In one embodiment, the circuitry of FIGS. 2 and 3 will be provided for each block 54 so that there are 32 such circuits on a single device 50. Alternatively, for that circuitry which can be shared between two blocks 50, only 16 such circuits will be needed, as will be apparent to those of skill in the art. In one embodiment, the memory device 50 is capable of receiving 32 bits of data simultaneously and outputting 32 bits of data simultaneously. Therefore, all circuitry required to input and output 32 bits of data simultaneously is provided, such as 32 input/output buffers, and the like. The 32 bits can be provided by simultaneously accessing one memory cell in each of the 32 blocks or, alternatively, by accessing 8 memory cells in one block within one quadrant and accessing four blocks one within each quadrant simultaneously. The circuits shown in FIG. 2 and FIG. 3 are thus provided for each individual block of memory array 54 and can have a 1 bit bus, an 8 bit bus, a 4 bit bus or the like.

As shown in FIG. 2, a data signal line 27 receives data and provides the data to input buffer 68. The data input buffer 68 outputs the data complement DC, on a signal line 70 and the data true DT, on a signal line 72. The input buffer is shown and described in more detail with respect to FIG. 6A.

A write driver 75 receives the data and outputs the data on signal lines write bit complement, WBC 74 and write bit true, WBT 76. The data input buffer also outputs the written data to an output buffer 98 on line 97.

The signal lines WBC 74 and WBT 76 are input to a column select circuitry 78. The column select circuitry 78 outputs the data on bit line complement BLC 80 and bit line true BLT 82 for writing to the memory array. The burst counter 40 outputs column select signals directly to the column select circuitry 78 for addressing specific bit lines within the memory array block 54. The BLC line 80 and BLT line 82 are connected to the memory array block 54 as shown in FIG. 3. The WBC and WBT signal lines 74 and 76 are also connected to a reset control circuit 84 which outputs signal lines reset and reset b.

Figure 11:
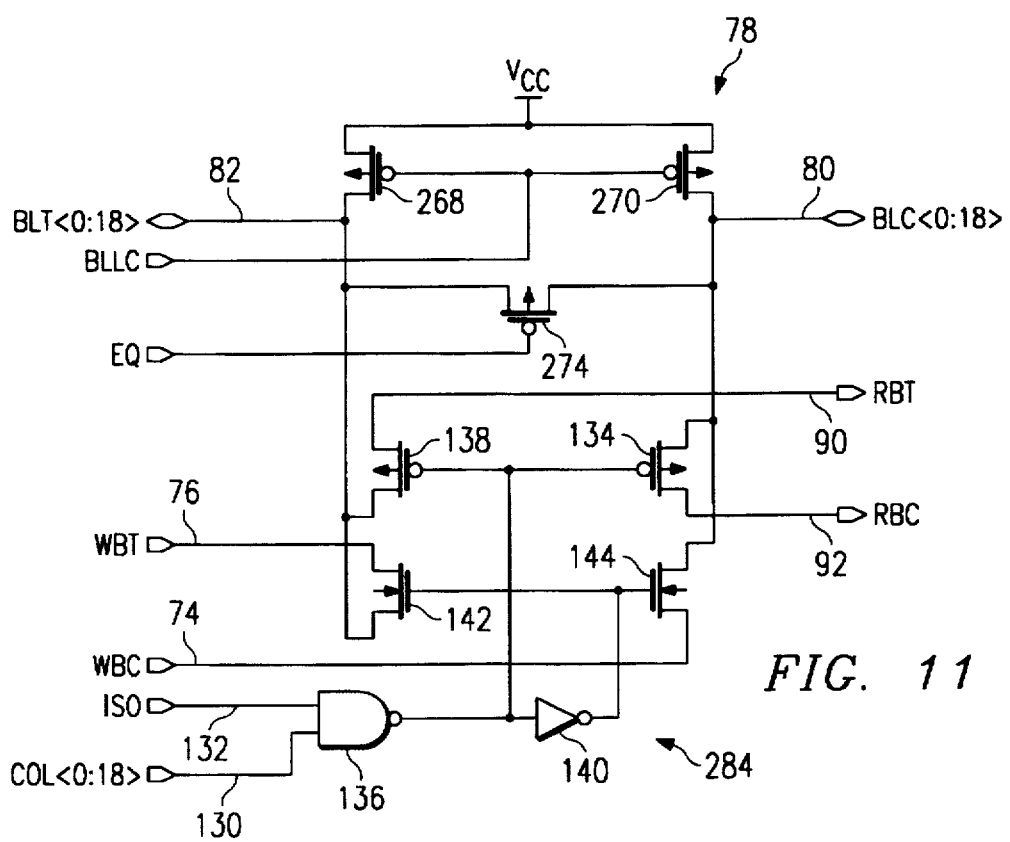
FIG. 11 is a detailed schematic of the column select circuitry as shown in FIG. 4A.

The column select circuit 78 also receives additional input signals to control reading and writing data to and from the memory array block 54 as explained in more detail with respect to FIG. 11.

Read bit complement RBC 90 and read bit true RBT 92 signal lines are output by the column select circuitry 78 and carry the read bit data when the circuitry is in the read mode. RBC 90 and RBT 92 are input to the sense amp circuitry 94 which operates to sense read data in a manner well known in the art.

FIG. 3 illustrates block diagrams of additional circuitry associated with the memory array blocks 54. In particular, an address decoder 102 receives address information and outputs address information to the word line and block select latch circuit 104. Additional address decode circuitry including an input buffer 106, an even/odd row address driver 108 and a word line select circuit 110 are part of the address decode circuitry. The word line select circuitry provides signals to the local word line driver circuitry 112 which outputs signals to drive the individual word lines of the memory array block 54 as shown in FIG. 3. As will be appreciated, the appropriate address decoder circuitry for the column address is also provided so that individual memory cells are accessible. Test mode logic 114 is also provided to permit testing of the memory device 50. Any acceptable circuits for the blocks of FIG. 3 may be used as is known in the art, the structure and operation of these circuits is not part of the present invention.

The detailed circuits for each of the blocks shown in FIGS. 2–3 can be implemented using conventional circuitry now available for performing such functions. As will be appreciated, specific embodiments for such circuitry are shown and described in the related applications mentioned on page 1 of the present application. However, such detailed circuits do not form a part of this present invention and, for purposes of this invention, any currently available circuitry for carrying out the functions described in the blocks is acceptable. The detailed features of this invention are best understood by viewing FIGS. 4A and 4B and the specific detailed circuits shown for carrying out the invention in FIGS. 5–13A and 13B.

Figure 4A:
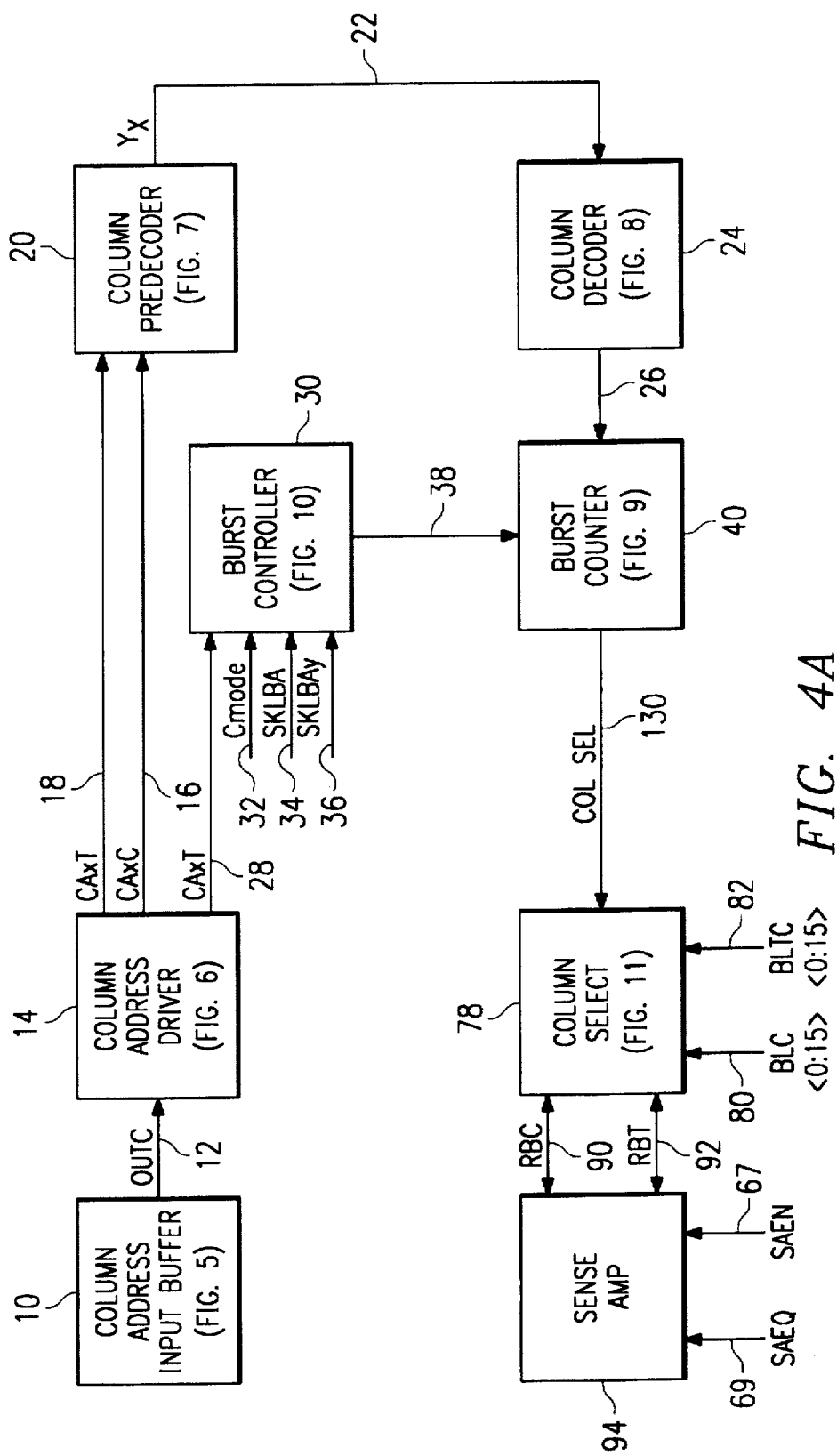
FIG. 4A is a block diagram of a first alternative embodiment according to principles of the present invention.

According to one alternative embodiment, the circuit shown in FIG. 4A is modified to provide a different connection of the burst counter circuit according to principles of the present invention. A column address input buffer 10 receives a column address directly from input pins. The column address input buffer 10 outputs the data on line 12 labeled OUTC which is input to a column address driver 14. The column address driver generates true and complement address signals corresponding to each address provided on the column address bus 12. These include the true column address x on line 18, labeled CAxT, and the complement column address x on line 16, labeled CAxC. In the present embodiment, x is a number from 0 to 13 because there are 4 addresses that are decoded to selected 16 columns in a group. The column address signals, true and complement, are input to a column predecoder 20. The column address signal is also input to a burst controller 30. In a preferred embodiment, X=0 on the particular signal line 18 which is provided to the burst controller 30 so that the burst controller 30 receives the least significant address bit from the current column address. The details of this implementation are described with respect to FIG. 10. The burst controller 30 outputs numerous control signals on multiple lines, labeled 38 as a group, to control the burst counter 40.

The column predecoder 20 receives the signals on lines 18 and 16 and outputs partially decoded address information, labeled Yx on line 22. The partially decoded address information is input to a column decoder 24. The decoded address data is output by the column decoder on line 26 and input to burst counter 40. The burst counter 40 outputs a column select signal on line 42 which is input to the column select circuit 78. The column select circuit 78 as shown in FIG. 4A is the same as that shown in FIG. 2.

This is the path which the address follows for either writing data to or reading data from the memory array via lines 80 and 82 also shown in FIG. 2. When data is read from the array, it is output on read bit true line 92 and read bit complement line 90 for sensing by sense amp 94.

As shown in FIG. 4A, the burst controller 30 is coupled to directly receive the column address information from the column address driver 14 simultaneously with the column predecoder 20 receiving such information. The burst controller 30 remains coupled to the burst counter 40 to generate control signals on lines 38 to control burst counter 40, however, rather than receiving the decoded column address information, the burst controller receives the column address information directly. In a still further alternative embodiment, as shown in and described in more detail with respect to FIG. 4B, the burst controller is coupled to the predecoder 20 and receives the first stage predecoded address information. The burst controller contains an encoder circuit for reestablishing the original column address signal from the predecoded column address information received on line 22, Yx. The burst controller outputs signals on line 38 to control the burst counter as explained in more detail herein.

According to a further alternative embodiment, the burst controller 30 is coupled to receive the output from the column decoder 24 and reencode the signals to determine the interleaved direction in the event it is operating in the interleaved mode.

Figure 4B:
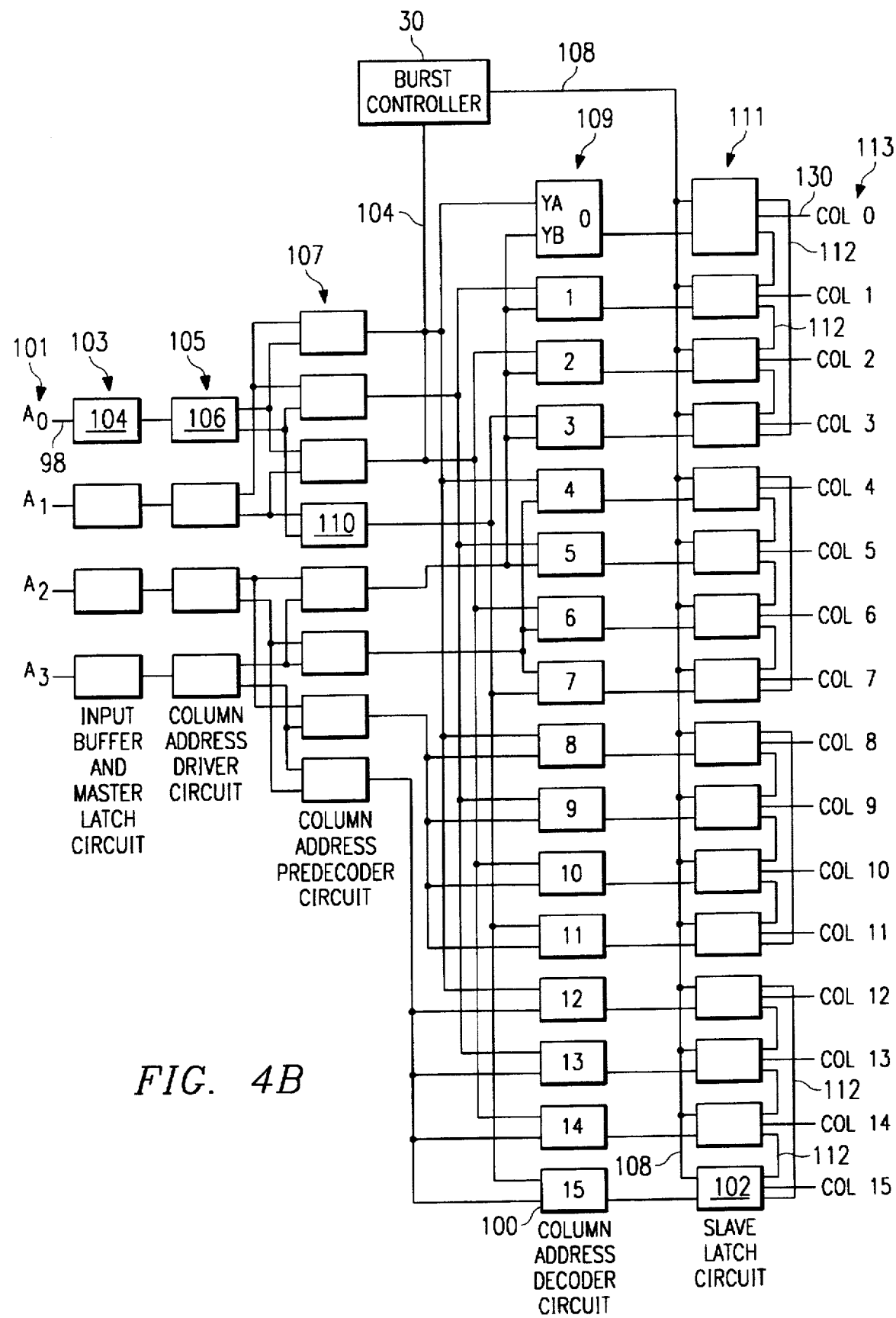
FIG. 4B is a more detailed block diagram of a second embodiment according to principles of the present invention.

FIG. 4B is a detailed block diagram of one preferred embodiment of the present invention. The column address signal 101 is input to an input buffer master latch circuit 103 on individual address lines 98. This input buffer master latch circuit is made of a number of buffer and master latch circuits 104 and is represented by the column address input buffer 10 of FIG. 4A. The output of the input buffer and master latch circuit 103 is input to a column address driver circuit 105, which is made of individual driver 106 and corresponds to the column address driver 14 of FIG. 4A. The output of the column address of driver 105 is input to the column address predecoder circuit 107, which is made of predecoders 110 and is shown in block form as column predecoder 20 in FIG. 4A. The output of the column address predecoder 107 is input to the column address decoder circuit 109. The burst controller 30 also receives the output of the column address predecoder. The output of the column address decoder circuit 109 is input from individual decoders 100 to the slave latch circuit 111. The slave latch circuit 111 is within the burst counter 40 in FIG. 4A. The slave latch circuit 111 outputs column select signal 130 on a selected one of a plurality of column signals output on lines 130 from the slave latch and the column. These individual column lines therefore correspond to the column select line 130 of FIGS. 2, 4A, and 11. The individual slave latches 102 are each connected to the adjacent slave latch by lines 112. The top latch 102 is connected to the bottom latch 102 as shown by the lines and arrows on each.

The output of the column address predecoder circuit 107 is also input to the burst controller 30, on lines 104, and the burst controller 30 outputs signals to the slave latch circuit 111 on lines 108 for controlling the selection of the various columns in the memory array under control of the slave latch even though the address in the master latch does not change, as explained in more detail herein.

The column address circuit as shown in FIG. 4B illustrates the circuitry for four individual address signals 98, the column address as a whole 101 being made up of the individual address signals 98. While only four column address signals are used as shown in FIG. 4B, in an alternative embodiment there are sixteen such individual column address signals and the circuitry shown in FIG. 4B is provided four times on the alternative memory device 50 to permit a burst counter of 16 bits. Depending on the number of column addresses controlled by the burst counter, four address pins, as preferred in the circuit herein, or pins, the circuitry is provided and connected and as needed, some memory device having only twelve address pins or any other number being controlled by the burst counter.

Figure 5:
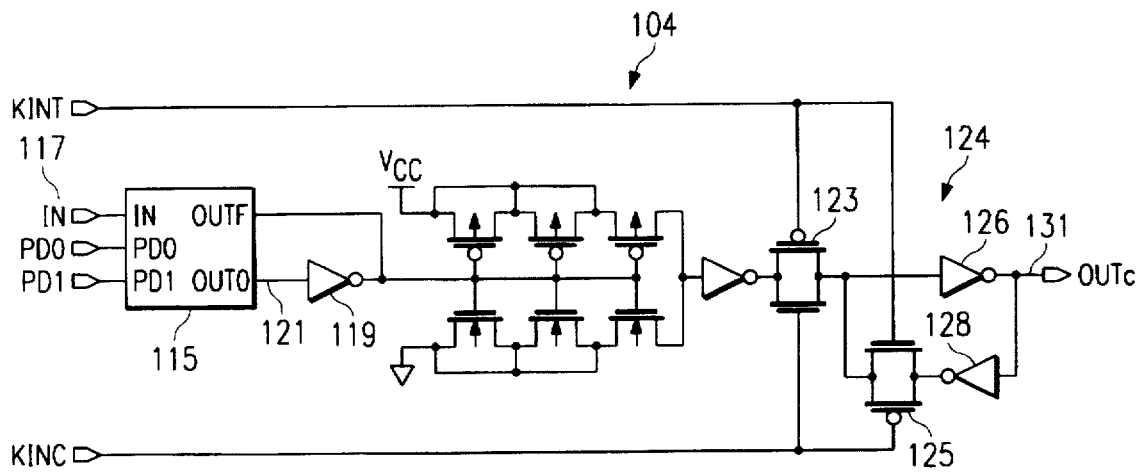
FIG. 5 is a detailed circuit schematic of the input buffer and master latch of FIG. 4B.

FIG. 5 is a detailed schematic of one of the input buffers and master latch elements within the input buffer and master latch circuitry 103 of FIG. 4B. The individual input buffer and master latch includes a TTL input buffer 115 of a standard type which outputs the complemented address input signal from line 117 to an inverter 119 on line 121. The data is delayed and presented to transfer gate 123. Transfer gate 123 is enabled or disabled by the internal clock K on signal lines KINT and KINC. When the transfer gate 123 is enabled, the data is transferred to a master latch 124 having a pair of inverters 126 and 128 for holding the address information. When the internal K clock is high, transfer gate 125 is enabled to maintain the logic level in the master latch. The state of the logic level in the master latch does not change until new address data is positively inserted via transfer gate 123 by clock going low. The column address data complement output is provided on line 131 labeled OUTC. When the clock K is high, transfer gate 123 is disabled and transfer gate 125 is enabled to block the change of address information in the master latch 124 while the clock K is in the high state.

Figure 6:
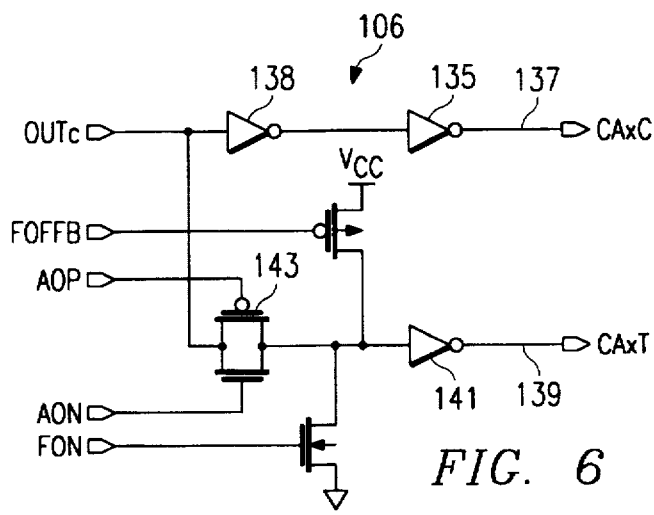
FIG. 6 is a detailed circuit of the column address driver of FIG. 4B.

FIG. 6 shows the generation of true and complement column address signals CAxC and CAxT corresponding to one of the 4 column addresses. The complement column address data is generated from the input by two inverters in series 138 and 135. In addition, the true column address data is output on line 139 as signal CAxT by being passed through an inverter 141 when transfer gate 143 is enabled. The remaining inputs to the write driver labeled FOFFB and FON provide signals when carrying out certain tests of the memory device 50 and do not relate to the passing of column address signals during normal circuit operation and therefore not discussed in detail here.

Figure 7:
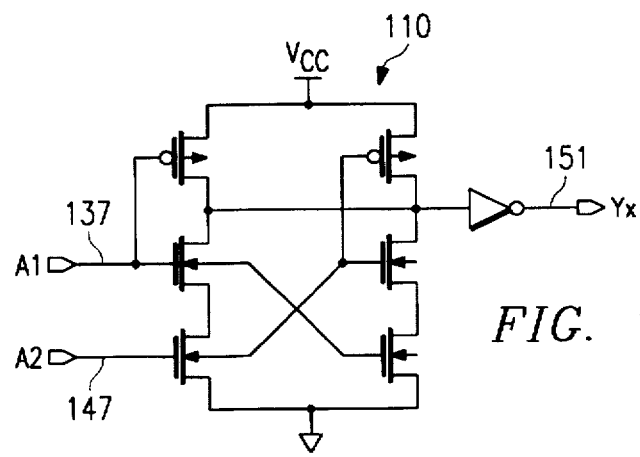
FIG. 7 is a detailed circuit of the column address predecoder of FIG. 4B.

FIG. 7 is a block diagram of one example of a predecoder circuit. The design and operation of predecoder circuits are well known in the art and need not be described in detail. The address input data from two different address driver circuits labeled A1 and A2 in FIG. 7 correspond to CAxT or CAxC for two address bits from FIG. 6. The address inputs are provided to the predecoder on lines 137 and 147, respectively. The output of the predecoder circuit contains first stage predecoded signals on line 151. Preferably, a second set of predecoder circuits are used to predecode other portions of the address input signals, not shown here. Alternatively, a column address decoder circuit may be used instead of one or more predecoder circuits. However, use of one or two stages of predecoders prior to a decoder circuit usually simplifies the circuitry required for selecting individual columns.

Figure 8:
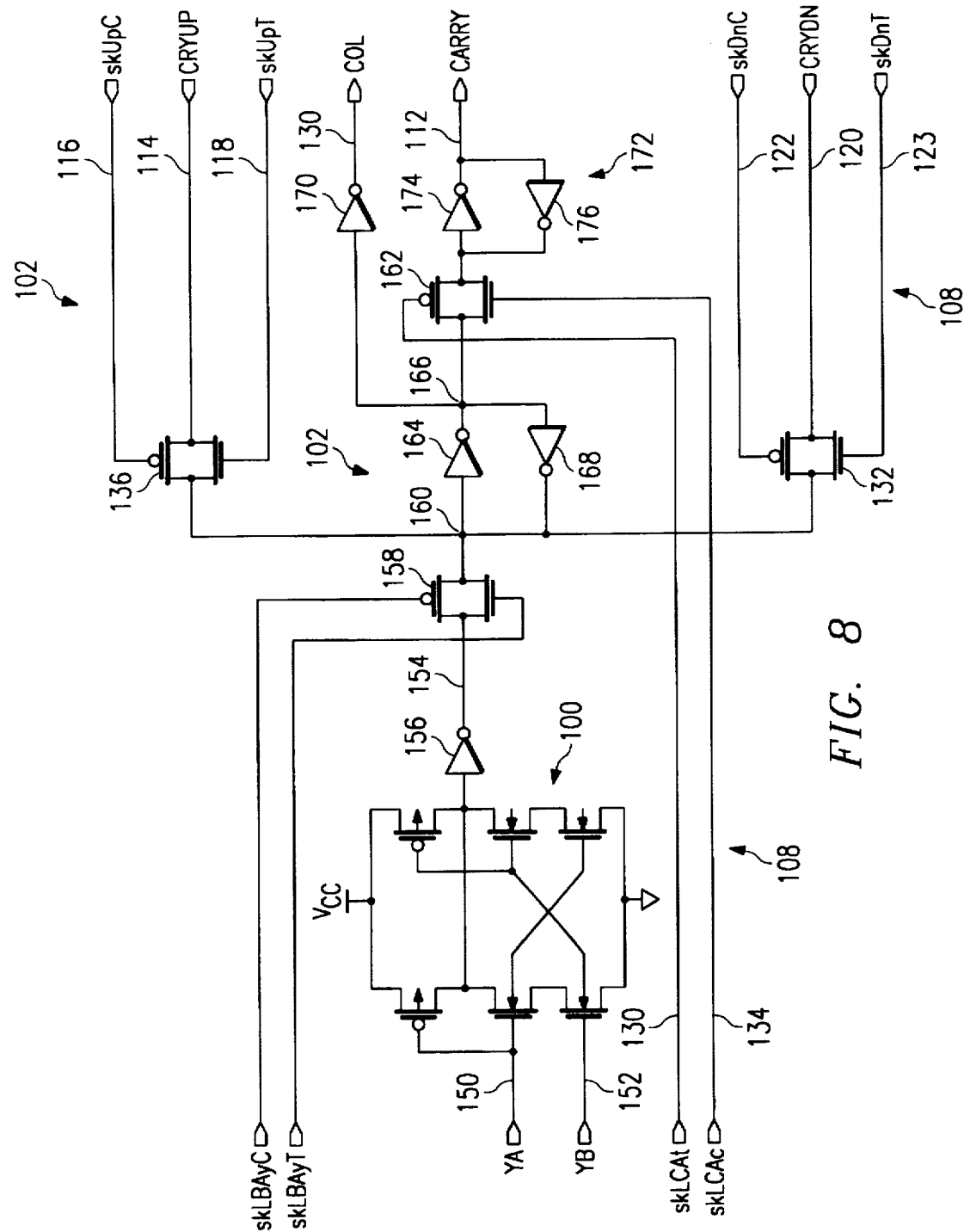
FIG. 8 is a detailed circuit of the column address decoder and slave latch as shown in FIG. 4B.

FIG. 8 is a detailed schematic of a column address decoder 100 and a slave latch 102 constructed according to principles of the present invention. Signal YA is input at terminal 150 and signal YB is input at terminal 152. These are address signals which have been output by the predecoder circuit 20 on respective signal lines 22. Decoder circuit 100 completes the decoding of the column address signals and presents a decoded column address signal at node 154 as the output of the inverter 156. The decoded address signal is held at node 154 while transfer gate 158 is disabled. Upon address clock skLBAyC going low and clock skLBAyT going high, the transfer gate 158 is enabled, which passes the decoded column address signal to the input of latch circuit 102 for storing at node 160. After the decoded address information is stored at node 160, transfer gate 158 is disabled so that the state of the decoded address information cannot be changed even if the address inputs YA and YB on lines 150 and 152 are changed.

The address decoder 100 is a simple address decoder and takes advantage of having predecoder stages prior to the signal on lines 150 and 152 being presented to the decoder 100. In alternative embodiments, the decoder circuit 100 is a much more complex circuit which performs the complete decoding of the address information in a single decoding circuit. As will be appreciated, any acceptable decoding circuit could be used in place of the one shown herein.

The slave latch 102 of the input register is made up of the CMOS transfer gate 158 that is driven by the decoded address buffer 156 from node 154. This transfer gate is controlled by the complementary clocks skLBAyT and skL-BAyC which allows the propagation of new address data only when the clocks enable transfer gate 158. The cross-coupled inverters 164 and 168 are connected to the output of the transfer gate at node 160 to store the decoded address signal between transitions of the new address clock skLBAy. A large inverter 170 is coupled to the output of the latch at node 166 and drives the column line 130 to provide the column select signal.

Also coupled as an output of the latch circuit 102 is a carry circuit 172. The carry circuit is comprised of a transfer gate 162 and cross-coupled inverters 174 and 176. The output of the carry circuit is provided on line 112 and is connected to the adjacent slave latches on either side, as explained in more detail herein.

Transfer gate 162 is enabled and disabled by a control of clocks skLCAt and skLCAc. When clock skLCAt is low, the transfer gate 162 is enabled to provide new carry bit data to the master carry latch 172 and place it on the CARRY signal line 112. After the carry information is held on the CARRY line 112, carry clock skLCAt and its complement, skLCAc, disable the transfer gate 162 so that the data remains unchanged on CARRY signal line 112. The data is held in this state until the transfer gate 162 is again enabled because the master latch circuit 172 holds the data.

The various drive buffers, such as inverters 156, 170, 174 and 164, and made of the appropriate size for driving the circuits to which they are connected. As will be appreciated, drive buffer 170 is made of a fairly large size because it drives the column selection circuitry. In one embodiment, the driver 170 has a P-channel transistor with a W/L ratio of 192 and an N-channel transistor of a W/L ratio of 128. Of course, any other size may be used for the driver circuit 170 as appropriate for the particular circuit configuration.

Advantageously, the state of the information stored in slave latch 102 can be changed under control of a clocking circuit other than the address input clock. In particular, the clock for driving the slave latch 102 can operate at a much higher rate than the address clock skLBAy thus provide a new column select line at a faster rate than a new column address can be provided from the column address input buffer under the control of the column address clock skL-BAy as explained in more detail herein.

Carry up signal line CRYUP 114 is coupled to the carry signal of the next adjacent slave latch 102 below the current slave latch. Further, the carry down signal line 120 is coupled to the output carry line 112 of the next adjacent latch immediately above the instant slave latch 102. Therefore, when a signal is received on carry up line 114, it is transferred in an upward direction, from the slave latch immediately below. Similarly, when a signal is received on carry line 120 is it received from a slave latch immediately above so that the signal is being carried down.

The timing for controlling the input of new column select information on either the carry up or the carry down line is controlled by the carry up and carry down clocks from the burst controller 30. The carry up clock is connected to signal lines 116 and 118 labeled skUpC and skUpT. These signal lines are connected to the transfer gate 126. Upon the carry up clock being enabled, skUpC goes low, which enables transfer gate 126 for placing the decoded address information signal on line 114 into node 160. Upon the new decoded address information being written to node 160, the state of the data changes at node 166 so that new decoded address information is stored at node 166 and output to column line 130 via driver 170. The inverter 168 is a weak keeper latch, generally made of smaller drive transistors so that the data node stored at 160 may be easily overcome by the positive assertion of new data from carry up line 114.

In a similar fashion, decoded address information can be provided on the carry down line 120 from the master latch 172 in the next adjacent counter 302. The carry down line is enabled by carry down clocks skDnC and skDnT. When clock skDnC is low, transfer gate 132 is enabled to transfer decoded column address information from the above slave latch 102 into the instant slave latch 102 for storing at node 160.

As will be appreciated, the up clock and down clock will not be operational at the same time. Rather, either the up clock or the down clock will be enabled depending on the type of interleave pattern under control of the burst controller circuit, as explained in more detail herein.

Advantageously, the carry transfer clock skLCA, in both its true and complement form, is clocked while the master address clock skLBAy is nonconductive. Similarly, if either the up clock skUp or the down clock skDn are activated, the address clock skLBAy will not be active so as to avoid contention between the decoded address information which is to be stored in node 160. The burst control circuit controls these clocks to ensure that there is no contention between these four different clock circuits, as shown and described with respect to the burst controller. In addition, all clocks are in pulse form to further avoid contention problems. The inverted clocks are matched with each other to avoid feed-through problems. Thus, burst control clock skLCA is true and complement clocks are matched and in pulse form to avoid feed-through problems. The true and complement signals of the skUp clock and skDn clock are also provided in matched form.

To ensure clean and trouble-free operation, the carry clock skLCA cannot enable transfer gate 162 while transfer gate 132 or 136 are enabled. The clocks are assured of controlling the transfer gates such that they are always in opposite states, conductive and conductive, respectively. The carry clock skLCA enables the transfer of the previous address information to master latch 172 while transfer gates 132 and 136 are disabled. Once transfer gate 162 is disabled, gate 132 or 136 can be enabled, depending on the mode of operation for the counter 40 acting as a shift register.

Figure 9A:
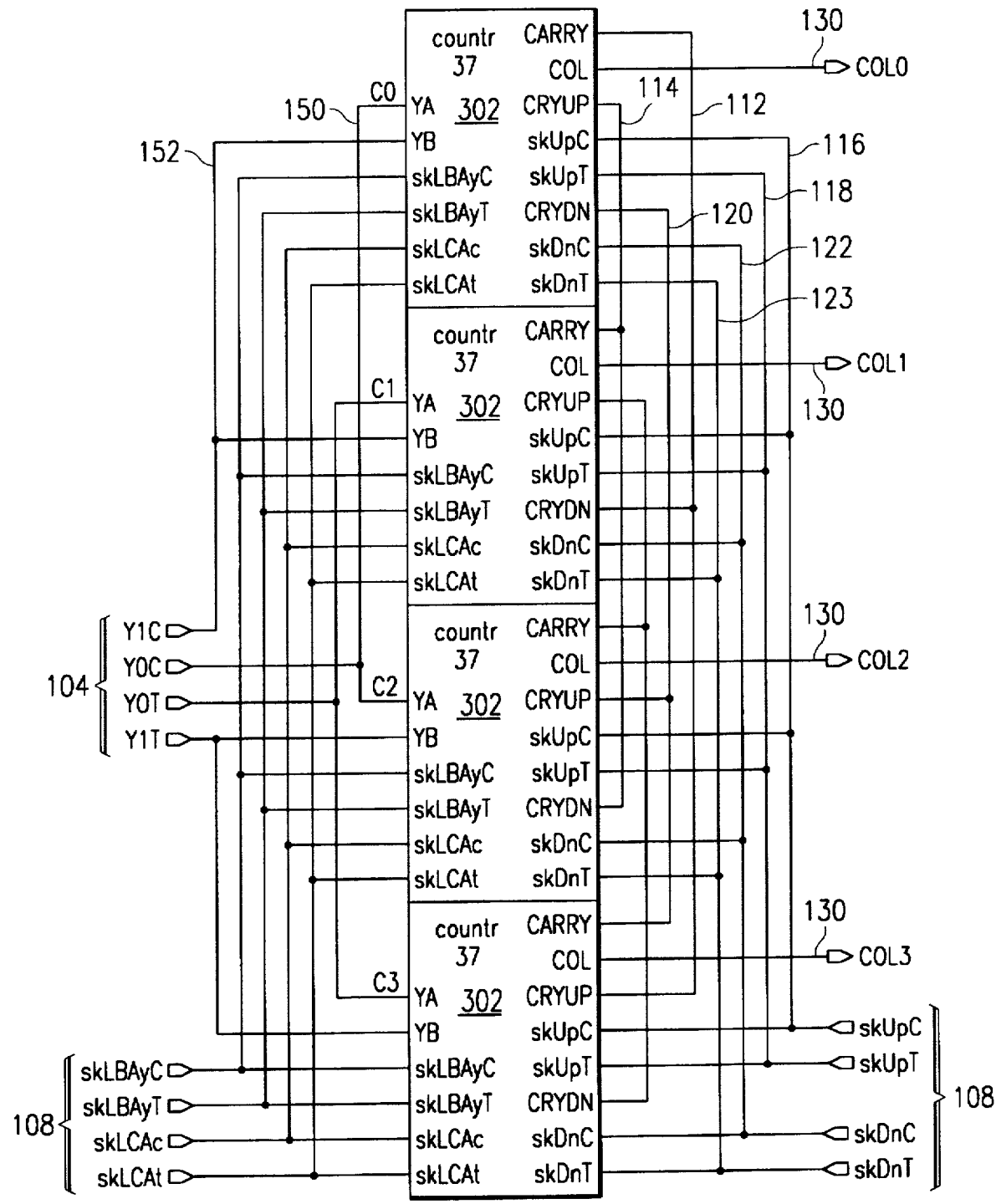
FIG. 9A is a block diagram of slave latch circuitry having four slave latches coupled to each other.

FIG. 9 illustrates four counter blocks 302 showing the connection of one counter 302 to the next adjacent counter 302 to form the burst counter 40. The input terminals shown correspond exactly to those terminals shown in FIG. 8 with respect to the decoder 100 and the latch 102.

Within each counter shown labeled 302 in block diagram, there is a decoder 100 and a slave latch 102. They are referred to individually as counters 302 as a block being the burst counter 40. As will be appreciated, in some designs the decoder 100 is in a separate block and may in fact be in a different location on the chip. For convenience's sake, they are shown in a single counter block 302. Preferably, the slave latch 102 is located as close to the column select line as possible, even though the decoder 100 may be located much closer to the address input pins.

In this preferred embodiment, the two circuits are located close together, both of them being positioned close to the column selection circuitry to directly drive the column select line in as short a time as possible and making up the burst counter circuit 40. In an alternative embodiment, the slave latch 102 is located in the same position, immediately the column select line, but the decoder is located spaced apart, in a different logical block.

Since the counter blocks 302 include both the decoder circuitry and the slave latch circuitry, the inputs receive address information along with receiving address clock signals and burst clock signals. As can be seen, each counter 302 receives input signals on terminals YA, YB, skLBAyC, skLBAyT, skLCAc, and skLCAt.

As shown in FIG. 9, predecoded address information is provided on the group of lines 104 from the column address predecoder 107. The predecoded address information is provided on lines 104 and input to each of the counter circuits 302. As will be appreciated, there are four sets of the groupings of four counter circuits 302 making in total 16 counter circuits 302 for providing sixteen column output lines 130 to drive each of the sixteen column selection signals within each memory block. The address control clock signals, as well as the burst counter control clock signals are also input on lines 108 to the counter 302. The up and down clock counter signals are also input to the counter 302 for controlling the direction of the count.

As can be seen by viewing the connections of FIG. 9, each CARRY line 112 from each counter 302 is coupled to the next adjacent above and below counter circuit 302. This provides the decoded address information to the adjacent counter blocks 302 so that either a count up or count down pattern may be followed. The CARRY signal from the top counter 302 wraps around to the bottom counter circuit 302 for performing the carry up operation, and wraps around from the bottom circuit 302 to the top circuit 302 for performing the carry up operation, as can be seen by viewing the figures.

Figure 10:
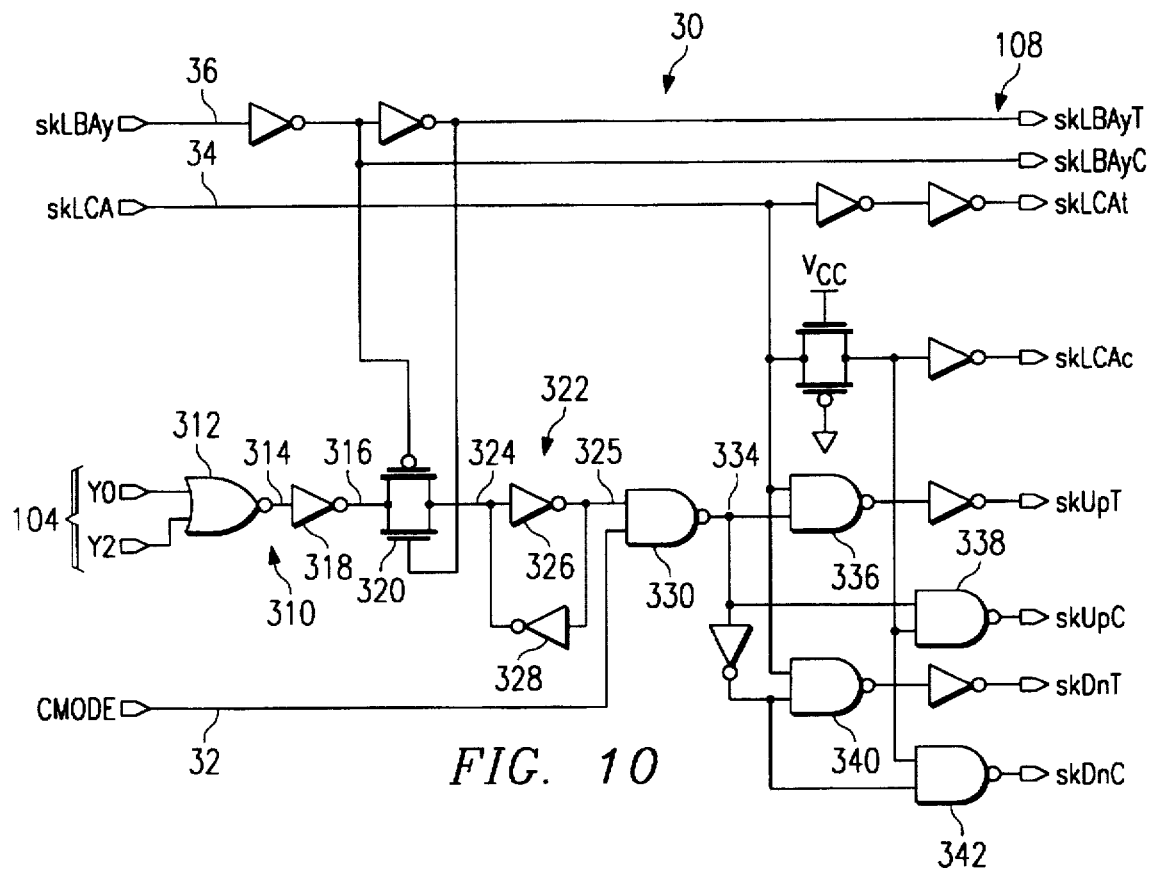
FIG. 10 is a detail schematic of a burst controller of the type shown in the embodiment of FIG. 4A.

FIG. 10 illustrates the structure and operation of the burst controller 30, as shown in FIGS. 4A and 4B. The burst RAM according to the present invention has the ability to control the direction of counting up or counting down. It also has the ability to sense whether the counting should proceed in an up direction or a down direction based on the state of the address input. It thus can operate in either an interleaved mode or in a linear mode. If the count is to proceed in an upward fashion, then complementary clocks skUpT and skUpC must conduct in the proper timing sequence. If the count is to proceed in a downward direction, then complementary clocks skDnT and skDnC are enabled. The signals CRYUP and CRYDN come from the carry signal in the cell below and from the carry signal in the cell above, respectively. The burst controller 30 determines the direction of the count and activates either the up or down counter clocks, but not both.

As shown in FIG. 10, the burst controller 30 includes an address encoder circuitry 310, which in this embodiment includes a NOR gate 312. The NOR gate 312 receives the predecoded address information on lines 104. In the embodiment shown, the burst controller 30 receives the least significant address bit from each address although, in alternative embodiments it may receive the most significant bit or other bits to be decoded for controlling the direction of the clock. However, according to a preferred embodiment of the present invention, the state of the least significant bit is used to control whether the clock proceeds in an up fashion or a down fashion, as will now be explained.

The NOR gate 312 encodes the predecoded address signals to once again obtain the least significant bit A0 at node 314. This least significant bit information is transferred to node 316 via inverter 318. Upon clocking of the new address clock on line 36, transfer gate 320 conducts to place the least significant bit column address into latch 322 and stored in node 324. Latch 322 is composed of inverter 326 and inverter 328.

The least significant address bit is then stored at node 325 for controlling the operation of the burst counter for selective modes of operation during subsequent count steps. The output of the latch 322 is provided to a NAND gate 330. The other input to the NAND gate is on line 32 which is the CMODE signal for indicating whether the burst controller 30 will force a count in the upmode or in the downmode. The signal on line 32 is derived from the pin LBO shown and described in more detail later herein. If the signal CMODE is low, then the output of NAND gate 330 is forced high. Forcing the output of NAND gate 330 high at node 334 forces the burst counter to always count in the up direction. This enables the upclock's skUPC and skUpC so that each incremented account is in the upward direction. It also disables the down clock's skDnT and skDnC so that counting in the downward direction cannot occur. The linear mode of operation has been designated as the preferred mode for certain types of processors, such as the power PC, the Cyrix M1, many Motorola products, as well as RISC processors.

The burst counter therefore can be placed in a linear burst mode by a control of the CMODE signal on line 32.

Shown below in Table 1 is the sequence for the burst counter if the linear mode is selected.

bit, A0, is encoded and stored at node 325 as has been explained. When a burst sequence begins, the columns are selected in the sequence shown in Table 2. Namely, for a beginning address of the least two significant bits being both

TABLE 1

| LINEAR BURST SEQUENCE (LBO= GND) | | | | | | | | | |
|---|---|---|---|---|---|---|---|---|---|
| | | BEGIN 1 | | BEGIN 2 | | BEGIN 3 | | BEGIN 4 | |
| BURST STARTING ADDRESS: | | A1 | A0 | A1 | A0 | A1 | A0 | A1 | A0 |
| Load External Address | A14–A2 | 0 | 0 | 0 | 1 | 1 | 0 | 1 | 1 |
| 1st Burst Address (Internal) | A14–A2 | 0 | 1 | 1 | 0 | 1 | 1 | 0 | 0 |
| 2nd Burst Address (Internal) | A14–A2 | 1 | 0 | 1 | 1 | 0 | 0 | 0 | 1 |
| 3rd Burst Address (Internal) | A14–A2 | 1 | 1 | 0 | 0 | 0 | 1 | 1 | 0 |

Note: The burst count sequence wraps around to the initial address after a full count is completed.

As can be seen by referring to the Table 1 above, the linear burst sequence causes the address to be incremented in an up count fashion, regardless of the beginning state. The user thus is able to selectively control whether the burst address is output in an interleave fashion or in a linear fashion by control of the state of the LBO pin.

On the other hand, some microprocessors on the market specify that the burst mode sequence is to be in an interleave pattern. Microprocessors in this group include Intel products such as the Pentium, the i486 and other Intel products. If the CMODE signal is in the high state on line 32, the burst counter controller counts is in the interleave pattern. Counting in an interleave pattern is one significant advantage of the present invention in which the state of the least significant address bit A0 as stored in node 325 controls the direction of the count whether up or down as will now be explained.

Table 2, printed below, shows the burst counter address sequence for an interleave burst. In this embodiment, the interleave burst sequence is enabled by holding $\overline{LBO}$ in the high position. This places the signal on line 32 high. Referring now to Table 1, reproduced below:

0, according to the interleave pattern, a count up is performed of the last two bits to access the columns that correspond to the addresses indicated by each new group of addresses A0–A14 on each burst cycle. On the other hand, if the least significant bit begins as a 1 as shown in the column labeled Begin 2, then, according to the interleave pattern, the address is incremented down so that the appropriate column select signals are generated. The effective address signals for the other potential beginning addresses for the least two significant bits are shown as Begin 3 and Begin 4 in Table 2.

Returning now to FIG. 10, if the address of the least significant bit A0 is a 1 so that the input at node 325 of NAND gate 330 is a high, then the burst counter will force a count in the down direction. Namely, the output of NAND gate 330 is forced low which enables the down count clock skdn in order to count down and disables the up counting clock skUp. Similarly, if the bit stored at node 325 is low, corresponding to the least significant address bit being low, then the output of NAND gate 330 is high, which forces the counter to count in an up direction. Thus, in the interleave mode, the state of the least significant address bit, whether 0 or 1, controls whether the counter counts up or down. As

TABLE 2

| INTERLEAVE BURST SEQUENCE (LBO= VCC) | | | | | | | | | |
|---|---|---|---|---|---|---|---|---|---|
| | | BEGIN 1 | | BEGIN 2 | | BEGIN 3 | | BEGIN 4 | |
| BURST STARTING ADDRESS: | | A1 | A0 | A1 | A0 | A1 | A0 | A1 | A0 |
| Load External Address | A14–A2 | 0 | 0 | 0 | 1 | 1 | 0 | 1 | 1 |
| 1st Burst Address (Internal) | A14–A2 | 0 | 1 | 0 | 0 | 1 | 1 | 1 | 0 |
| 2nd Burst Address (Internal) | A14–A2 | 1 | 0 | 1 | 1 | 0 | 0 | 0 | 1 |
| 3rd Burst Address (Internal) | A14–A2 | 1 | 1 | 1 | 0 | 0 | 1 | 0 | 0 |

Note: The burst count sequence wraps around to the initial address after a full count is completed.

As shown in Table 2 above, when the interleave burst sequence is selected, the external addresses A0–A14 are input to the address input buffer. The signals A2–A14 are decoded in a manner which has been explained for selection of memory array blocks and other address information. The least significant 2 bits are also decoded and provided to the column selection circuitry. In addition, the least significant will be appreciated, the count up circuit is controlled through NAND gates 336 and 338 while the count down circuits is controlled through NAND gates 340 and 342. The enabling of the output signals is controlled by the burst clock skLCA on line 34 which provides inputs to the NAND gates 336, 338, 340, and 342 for the generation of the respective up count clocks and down count clocks, depending on which is enabled by the NAND gate 330.

As will be appreciated, the burst clock skLCA, being controlled by external pin ADV, is able to directly access columns in the memory even though the address provided at the address input pins does not change. The burst controller 30 can cause the change in the respective column-select lines within the counter circuits 302 to directly drive the column-select circuit as shown in FIG. 11 at a much faster rate than could be controlled from an outside address. Further, since the decoded address signal has been stored, it is not necessary to decode each incremented address, rather, the already decode address information is incremented in a pattern which simulates the incrementing of the least two significant bits in the address as if it had been provided, even though the address does not change.

As will be appreciated, in a preferred embodiment of the invention, the burst counter is fully operational both during write cycles and during read cycles. Therefore, data can be written to the memory array using a burst write cycle under control of the burst counter 40 as controlled by the burst controller 30. Similarly, data can be read very quickly from the array under the control of the burst counter 40 by initiating the burst counter during a read cycle and accessing sequential memory locations.

In the embodiment of the invention shown, a two-bit counter of the address is provided so that 4-burst addresses are obtainable. In an alternative embodiment, 16-burst addresses are obtained using four pins. Given the circuitry of this invention, the same features could be used to provide a 4-bit counter circuit giving 16-burst addresses, 5-bit counter circuit providing 32-burst addresses, and so on.

Figure 9B:
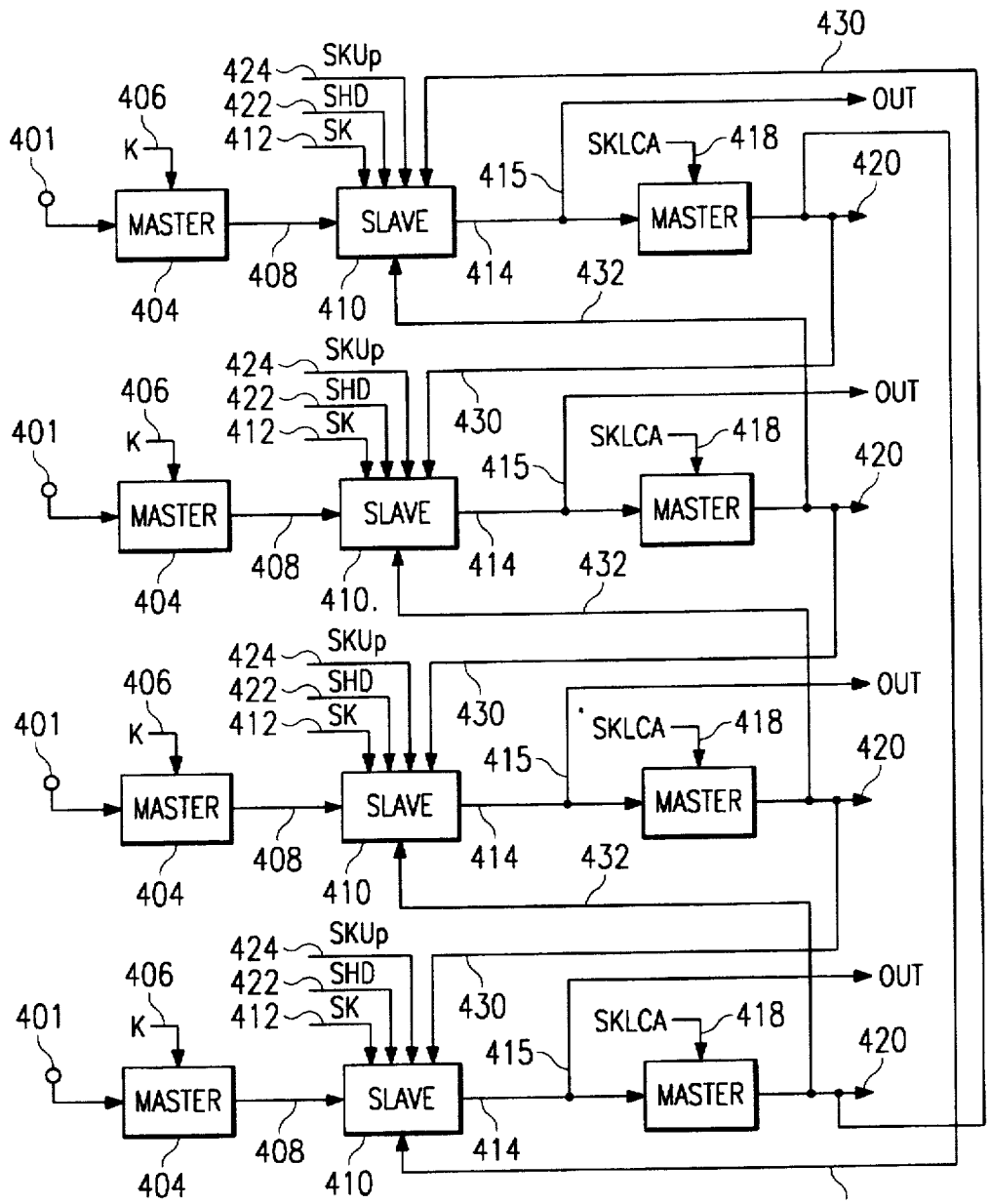
FIG. 9B is a block diagram of a switching master slave circuit according to principles of the present invention.

FIG. 9B illustrates the details of a further alternative embodiment according to principles of the present invention. A data input terminal 402 is coupled to a master latch 404. The clocking sequence of master latch 404 is determined by clock K on clock line 406. Each of the master latches 404 is controlled by the same clock K. The output of the master latch 404 is provided on output terminal 408 and input to slave latch 410. The input of data on line 408 to the slave latch 410 is controlled by a clock sk on terminal 412. The output of the slave latch 410 is provided on output terminal 414 to a second master latch 416. The input of data to master latch 416 is controlled by clock skLCA on terminal 418. The output of master latch 416 is provided on terminal 420. All master latches 416 are controlled by a same clock skLCA for inputting data into each individual master latch.

The input of data from the second master latch 416 to a slave latch 410 occurs under control of two separate clocks, either clock skDn or clock skUp. The clock skDn on terminal 422 clocks data from the master latch directly above the slave latch so the data is shifted in a down direction. Clock skUp on terminal 424 clocks data from the next adjacent below latch so the data moves in an upward direction.

The four slave latches labeled 410 can be analogized to be organized in a vertical column. Data can be moved in a vertical direction downward or upward along the vertical column of slave latches 410. In addition, it can also be moved in a horizontal direction from the slave latch to a master latch along the same horizontal data line.

The output of slave latch 410 is also provided on output terminal 415 to provide data to an operational logic circuit, not shown in FIG. 9B. The operation of the logic circuit is controlled based on the state of the data provided on output terminal 415.

The output of the second master latch 416 is provided as feedback to another slave latch 410 which is in the same level as the slave latch from which it received its information. This will now be explained. Each of the slave latches 410 can be viewed as being part of two data transfer directions. The first data transfer direction can be analogized to a horizontal transfer of data from a master latch 404 in a forward, or horizontal direction to the slave latch 410. The data is then transferred under control of a different clock to a further horizontal level, namely, the second master latch 416. There is thus a chain of four horizontal stages, from the input terminal to the first master latch under control of K clock being a first stage in the horizontal transfer. From the first master terminal 404 to the slave terminal 410 under control of a different clock in the horizontal direction to enter a third stage. The fourth stage being a transfer from the slave latch 410 to a second master latch 416 under control of yet an additional clock. The data is thus transferred through four stages in a horizontal direction under control of separate clock cycles at each stage.

The master-slave-master circuitry of FIG. 9B can be analogized to be organized in a vertical column of slave latches and a horizontal column of master-slave-master latches. Data is transferred vertically from one master latch 416 to a slave latch that is the same vertical column of the slave latch from which the master received the data.

The operation of the circuitry of FIG. 9B will now be explained. Data is held at a first stage on an input terminal 402. Under control of clock K data is transferred from the input terminal 401 to the master clock 404. The data can be held at the master clock as long as needed for purposes of the circuit operation. Transfer of the data into the slave latch 410 is controlled by clock sk which is provided on terminal 412 to each of the slave latches. The data is held in the slave latch 410 as long as needed for purposes of circuit operation. In addition, the data is provided out of the slave latch on output line 415 for providing the data to a logic circuit. The data is also made available to the second master latch 416. Under control of clock skLCA data is clocked into the second master latch 416 from the slave latch 410. During operation, the clock skLCA occurs after the clock sk. Therefore, data which was previously held in the slave latch 410 is transferred to the master latch 416. This data is stored in each of the master latches 416 on the same clock skLCA. After data is stored in the master latch 416, one of the vertical transfer clocks, either skdn or skUp transitions to transfer the data stored on the previous clock into the slave latch which is either vertically up or vertically down within the vertical column of slave latches 410. The data in each of the master latches 416 remains unchanged so that the data now stored in the slave latch is the current data which is being provided on output line 415. The data from the previous cycle is now stored in the second master latch 416. After some time, the master clock skLCA is pulsed to transfer the data into the master clock after which one of the vertical clocks, either skDn or skUp is pulsed to transfer the data from the previous slave cycle, now stored in the master into another slave circuit within the same vertical column. Data from the previous cycle is therefore rotated either up or down the vertical column of slave latches.

While only three clocks are shown for the slave latch 410, in one embodiment, additional clocks are provided for the slave latch 410 and additional feedback paths are provided from the master latch 416 to additional of the slave latches 410 besides only the slave latches immediately adjacent any of the up or down vertical direction. Using additional clocks or additional connections permits the data to be selectively transferred from any master latch in the fourth horizontal level to any slave latch in the third horizontal level.

The circuitry of FIG. 10 and detailed description thereof provides one embodiment for providing each of the clocks K, sk, skDn, skUp, and skLCA. As will be appreciated, the clocks sk, skDn, and skUp do not operate at the same time and preferably are timed to be assured of operating one clock only when the other clock is disabled. The clock K can be clocked to provide data in a synchronous pattern to the slave latches. In an alternative embodiment, the clock K is strobed only as needed to provide new data and is disabled while clocks sk, skDn, and skUp are operational in conjunction with clock skLCA. The clock sk is the same clock as skLBAy in one embodiment and in a different embodiment is a different clock on a different timing pattern. The data can be any type of data; for example, it can be column or word address data, data for storage in a memory array, data in, information data, pointer data, register tracking data or any other data.

As will be appreciated, the circuit of FIG. 9B provides the advantage of shifting data horizontally through four stages and also permitting the shift of data vertically in a column. By selectively strobing the clocks the circuit of FIG. 9B can operate as a shift register which shifts the data in a rotational pattern from one slave master stage to another. Alternatively, it can be operated as a counter and being provided in any start counter and counting either up, down, or in some other pattern as controlled by the clocks. A number of other logic functions can be performed by the circuit of FIG. 9B. While only four stages are shown in the horizontal shift direction and four stages are shown in the vertical column of slave latches 410, in alternative embodiments the vertical column is comprised of 16 slave latches while the horizontal column remains in four stages. The data can therefore be shifted among 16 slave stages in a vertical direction or provide a 16 bit counter which can be loaded at any desirable start count position.

FIG. 11 is a schematic diagram of one embodiment of the column select circuit 78 of FIG. 2. One set of circuitry is shown for a single pair of BLT 82 and BLC lines 80, it being understood that similar circuitry is included for the remaining 15 pairs of BLT and BLC lines. As shown, the circuit 78 includes a pair of active load transistors 268 and 270 that, when activated, couple the associated BLT and BLC lines 82 and 80 to the power-supply voltage VCC via a power-supply terminal 272. An equilibrate transistor 274 is coupled between the BLT and BLC lines 82 and 80. A pair of read passgates, here transistors 138 and 134 are coupled between the BLT and BLC lines 82 and 80 and the RBT and RBC lines 90 and 92, respectively. A pair of write passgates 142 and 144 couple the BLT and BLC lines 82 and 80 to the WBT and WBC lines 76 and 74. A column select circuit 284, which includes a NAND gate 136 and an inverter 140 receives the signal ISO via terminal 132 and the column line from the column select bus that is associated with the corresponding pair of BLT and BLC lines. For example, in one aspect of the invention, Y=15. Thus, there are 16 BLT/BLC line pairs that can be coupled to WBT and WBC lines 76 and 74. Thus, the circuit shown in FIG. 11 is replicated 16 times, one circuit for each BLT/BLC pair. Each of these 16 replicated circuits is coupled to a different one of the 16 lines that form the column select bus. Thus, when a particular memory cell is to be either read from or written to, the circuit associated with the corresponding BLT/BLC line pair has its column select line carry an active signal to couple the BLT and BLC lines to the appropriate read or write lines as is further discussed below.

The column select circuitry 78 is used for both writing data to and reading data from the memory array block 54. The circuit 74 therefore includes input signals WBT 76 and WBC 74 for providing data on bit lines BLT 82 and BLC 80 under control of the ISO and column select signals 130 and 132. As will be appreciated, when data is being written to the array the data true is provided on signal line WBT 76 and the data complement is provided on signal line WBC 74. While the data is present on the data bus lines, signals BLCC and EQ are held high while the signal COL 130 and ISO 132 are held high. The output of NAND gate 136 is low to turn on read control transistors 138 and 134 and the output of inverter 140 is high to turn on write access transistors 142 and 144. Data is thus passed from WBT 76 to BLT 82 and from WBC 74 to BLC 80 so that data is on the column lines for storing in each individual memory cell.

In operation, during a read or a write cycle, the $\overline{BLL}$ signal goes active low to pull up the BLT and BLC lines to approximately VCC. Prior to either a read or a write cycle, the $\overline{BLEQ}$ signal goes active low to equilibrate the associated BLT and BLC lines. The $\overline{BLEQ}$ signal then goes inactive high before the $\overline{BLL}$ signal goes active low. Also during a read or a write cycle, both the ISO and column select signals go active high to activate and thus close both the read passgates 276 and 278 and the write passgates 142 and 144. Such a circuit structure eliminates the need for separate passgates for the sense amplifier 94 (FIG. 2) that is coupled to the RBT and RBC lines 85 and 87. During a write cycle, the ISO signal remains active high during the entire write cycle. The ISO signal remains active high only for an initial period of a read cycle and then goes inactive low disabling, i.e., opening all of the passgates 138, 134, 142 and 144. This decouples the sense amplifier 94 from the BLT and BLC lines after it has sensed enough of the data value stored in the memory cell such that it can attain its steady state value more quickly because the parasitic capacitances associated with the BLT and BLC lines (and also the WBT and WBC lines 58 and 56 which are also coupled to the sense amp via the passgates 280 and 282) from the inputs of the sense amplifier.

Referring to FIG. 2 in one aspect of the invention, the block read-write control circuit 125 generates a separate ISO signal for each memory block. Thus, for all unselected memory blocks, the ISO signal remains inactive low during both read and write cycles to prevent the column select circuit 78 in unselected blocks from drawing dynamic current from the power supply. In the embodiment, the memory device 50 of FIG. 1 that has 32 memory blocks 14, where four memory blocks 14 are selected during each read or write cycle, then only four memory blocks 14 instead of 32 memory blocks 14 draw dynamic current during a read or a write cycle. Thus, in such an aspect of the invention, the dynamic current drawn from the power supply during read and write cycles is only one-eighth the dynamic current drawn by known memory devices. Such a significant reduction in dynamic power use allows the memory device 10 to be used in low power applications such as where the memory device 10 is powered by a battery.

Although a specific circuit is shown for the column select circuit 78 of FIG. 2, it is understood that other similar circuitry may be used to obtain the same advantages. For example, the P-channel transistors may be N-channel, and the N-channel transistors may be P-channel. Furthermore, a gate other than the NAND gate 136 may be used to form the column select circuit 284.

Figure 12:
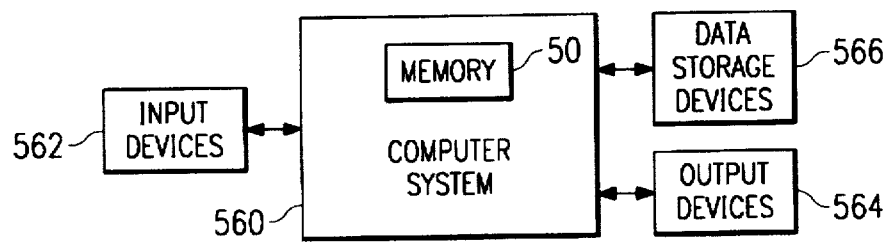
FIG. 12 is a block diagram of a system according to the present invention.
Figure 13A:
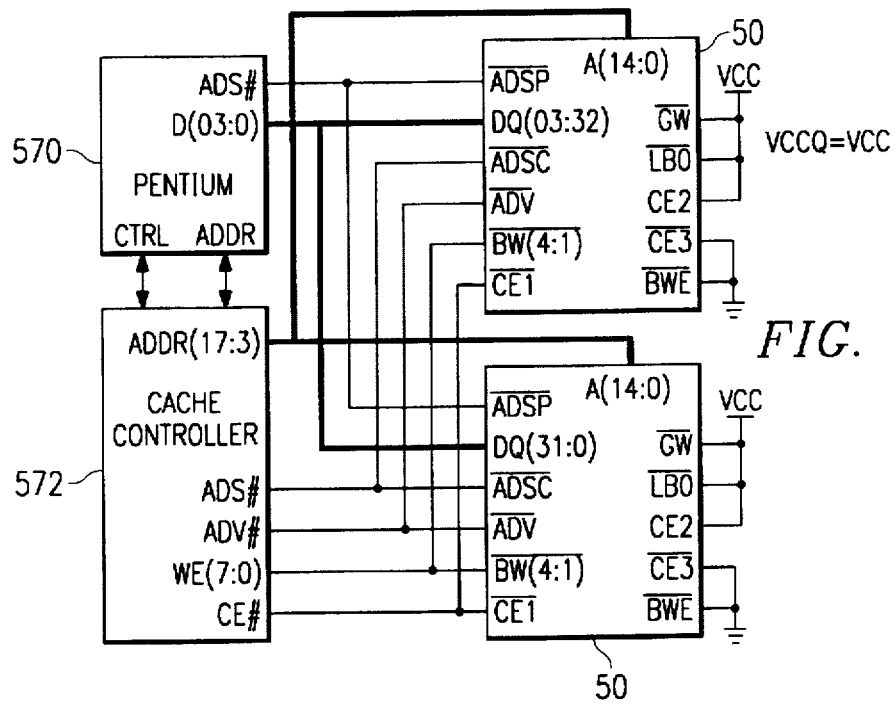
FIGS. 13A and 13B are block diagrams of alternative embodiments of a system using the present invention.
Figure 13B:
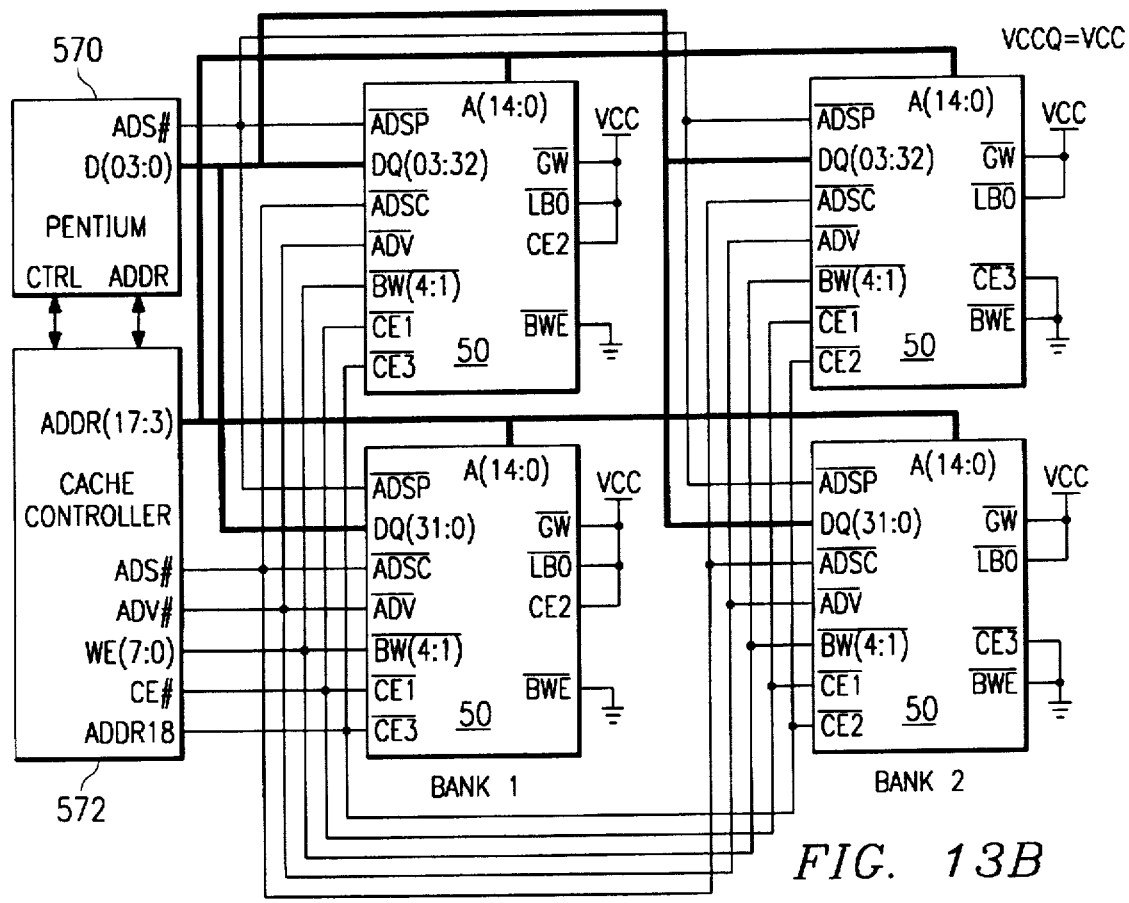

FIGS. 12, 13A and 13B illustrate systems which include a memory device 50 that incorporates the invention. FIG. 12 shows a memory 50 within a computer system 560. The computer system includes a microprocessor and other input/output devices. In a preferred embodiment, the computer system 560 includes a full 32-bit high speed microprocessor, such as those being sold by Intel, Motorola, IBM and other companies. The computer system may have connected thereto various input devices 562 and output devices 564. Additional data storage devices 566 which may include hard drives, CD ROMs or other off-site storage are also connected to the computer system 560. Using the high speed write memory device 50 of the present invention, the computer system 560 is thus able to write to and therefore perform all other operations much faster than was previously possible with other standard memory devices.

FIGS. 13A and 13B show additional specific uses for one embodiment of the memory device 50 according to the present invention. In one embodiment, the memory device 50 is a 32K×32-bit synchronous pipelined Burst SRAM, called a BRAM. It has pipelined output and can operate as a CMOS cache Burst SRAM.

Burst operations can be initiated with either $\overline{ADSP}$ (processor address status) or $\overline{ADSC}$ (controller address status). The burst advance input $\overline{ADV}$, allows the next burst address to be generated internal to the BRAM.

Cache burst read cycles are initiated with $\overline{ADSP}$, without regard to $\overline{ADSC}$ or $\overline{BWE}$, using the external address clocked into the on-chip address registers when $\overline{ADSP}$ is sampled low. All Chip Selects must be asserted for $\overline{ADSP}$ to begin the burst cycle. The output buffers will be enabled by $\overline{OE}$ when the BRAM is selected. If the device is going from a deselect to a select mode, the device will be selected and the outputs enabled on the following clock cycle. In a read operation, data accessed by the current registered address will be available tKQ from the next rising clock edge in a pipelined fashion.

The $\overline{ADV}$ input is ignored on the clock edge that samples $\overline{ADSx}$ asserted, but is sampled on all subsequent clock edges. The address is incremented internally to the BRAM for each read burst access where $\overline{BWE}$ and $\overline{GW}$ are sampled high, $\overline{ADV}$ is asserted low, and both address strobes are high. Data is always valid at tKQ for all Outputs (DQ0–31) from the rising of clock (K).

The $\overline{ADV}$ input (burst address advance) provides control of the burst counter. The $\overline{ADV}$ input controls subsequent burst data accesses after the first data of the burst cycle is processed. Each time $\overline{ADV}$ is active low for subsequent bursts at the rising edge of the clock input, the burst counter is advanced to the next burst address. The address is advanced before the operation. The BRAM will suspend the address burst sequence when the $\overline{ADV}$ pin is high during positive clock transitions. Upon completion of the full internal burst count, the address will wrap-around to its initial base address. The logic state of the $\overline{LBO}$ input determines the burst sequence as interleave (i486™ or Pentium™ for Intel bursts) or linear for other processors (RISC, PowerPC, Cyrix M1). The state of the $\overline{LBO}$ signal, whether high or low, controls the state of the CMODE signal of FIG. 10.

Write cycles are performed by disabling the outputs with $\overline{OE}$ prior to asserting $\overline{BWE}$. A global write enable ($\overline{GW}$=low) writes all 32 bits regardless of the state of $\overline{BWE}$ or individual byte write select inputs. When $\overline{GW}$ is high, one or more bytes can be written by asserting $\overline{BWE}$ and individual byte write selects ($\overline{BW1-4}$). A byte write table (not shown) lists which byte write selects controls DQ0–31. $\overline{BWE}$ is ignored on rising clock edges that sample $\overline{ADSP}$ low, but is sampled on all subsequent rising clock edges. Output buffers are disabled tKQHZ after K when $\overline{BWE}$ or $\overline{GW}$ is sampled low (independent of $\overline{OE}$). Data is clocked into the data input register when a proper write operation is implemented. The write cycles are internally self-timed, and are initiated by the rising edge of the clock input. A write burst cycle continues with the address incremented internal to the BRAM when $\overline{BWE}$ and $\overline{ADV}$ are sampled low at the next rising clock edge.

For one embodiment of the memory device 50, connected as shown in FIGS. 13A and 13B, Read or Write operations can be initiated with $\overline{ADSC}$ instead of $\overline{ADSP}$. The differences of these inputs are noted as:

1. $\overline{ADSP}$ must be high when $\overline{ADSC}$ is asserted low to initiate a cycle with $\overline{ADSC}$.

2. All Write Enable signals are sampled on the positive going clock edge that samples $\overline{ADSC}$ low (with $\overline{ADSP}$ high).

3. $\overline{ADSP}$ is blocked when $\overline{CE1}$ is high. The memory device 50 can be selected with either $\overline{ADSP}$ or $\overline{ADSC}$, but can only be deselected with $\overline{ADSC}$ when $\overline{CE1}$ is high.

The device of FIG. 13A includes two memory devices 50 connected to a Pentium processor to provide 256KB cache SRAM. The Pentium chip 570, working with cache controller 572, is able to have full 32-bit read/write access from each of the memory devices 50. The memory devices 50 include the self timed high speed write internally and therefore permit faster writing to the respective memory devices under the control of the Pentium 570 and cache controller 572.

FIG. 13B illustrates the computer system having a 512KB cache comprising four memory devices 50 connected to the Pentium 570 and cache controller 572 to provide additional data storage and burst operational capability. The memory device 50 thus provides an architecture for building a 32K×64-bit burstable L2 data cache SRAM array (256K bytes) by using only two (2) devices, as shown in FIG. 13A. Four (4) devices are used to provide a 512K byte cache, see FIG. 13B. The memory device 50 has three chip enables for easy depth expansion. The chip enables are registered to allow contention free operation when implementing a 512K byte, dual-bank cache configuration.

The invention has been described, including a large number of embodiments and alternative embodiments which may be used to implement the invention. As will be recognized, one embodiment of the invention includes an SRAM memory device. Any equivalent circuits which perform a similar function may be used and substituted for those described herein and thus fall within the claims of the present invention. The claims are therefore not limited by the description provided herein but are broad enough to cover and include alternative embodiments in equivalent circuitry for carrying out the claim features.

I claim:

1. A master slave circuit combination, comprising:

an input terminal for receiving input data;

a first master latch circuit coupled to the input terminal for storing data received from said input terminal;

a first clock terminal within the master latch for receiving a first clock signal to transfer data from the input terminal to the master latch;

a first slave latch circuit coupled to an output of the master latch, the first slave latch storing slave data and having an output terminal that provides slave data output;

a second clock terminal within the slave latch for receiving a second clock signal to transfer data from the master latch to the first slave latch;

19 a logic circuit coupled to the output terminal of the slave latch for logic operation based on the state of the data;

a second master latch coupled to the output terminal of the slave latch for receiving the slave data, the second master latch having an output terminal;

an electrical connection from the second master latch output terminal to a second slave latch; and a third clock terminal within the second slave latch for receiving a third clock signal to transfer data from the second master latch output to the second slave latch.

2. A master slave circuit combination, comprising:

an input terminal for receiving input data;

a first master latch circuit coupled to the input terminal for storing data received from said input terminal;

a first clock terminal within the master latch for receiving a first clock signal to transfer data from the input terminal to the master latch;

a first slave latch circuit coupled to an output of the master latch, the first slave latch storing slave data and having an output terminal that provides slave data output;

a second clock terminal within the slave latch for receiving a second clock signal to transfer data from the master latch to the first slave latch;

a logic circuit coupled to the output terminal of the slave latch for logic operation based on the state of the data;

a second master latch coupled to the output terminal of the slave latch for receiving the slave data, the second master latch having an output terminal;

an electrical connection from the second master latch output terminal to a second slave latch.

a third clock terminal within the second slave latch for receiving a third clock signal to transfer data from the second master latch output to the second slave latch; and a fourth clock terminal within a third slave latch for receiving a fourth clock signal to transfer data from the second master latch to the third slave latch.

3. The master slave latch circuit of claim 2 further including:

a fourth slave latch, the first, second, third, and fourth slave latches being organized in a vertical column for transferring data vertically from one slave latch to another slave latch.

4. A master slave circuit combination comprising:

an input terminal for receiving input data;

a first master latch circuit coupled to the input terminal for storing data received from said input terminal;

a first clock terminal within the master latch for receiving a first clock signal to transfer data from the input terminal to the master latch;

a first slave latch circuit coupled to an output of the master latch, the first slave latch storing slave data and having an output terminal that provides slave data output;

a second clock terminal within the slave latch for receiving a second clock signal to transfer data from the master latch to the first slave latch;

a logic circuit coupled to the output terminal of the slave latch for logic operation based on the state of the data;

a second master latch coupled to the output terminal of the slave latch for receiving the slave data, the second master latch having an output terminal;

an electrical connection from the second master latch output terminal to a second slave latch,

20 a third clock terminal within the second slave latch for receiving a third clock signal to transfer data from the second master latch output to the second slave latch; and wherein the input terminal, first master latch, first slave latch and second master latch are organized in a horizontal data transfer line for transferring data on a horizontal row.

5. A master slave combination, comprising:

a first input terminal for receiving input data;

a first initial master latch coupled to the first input terminal for storing data received from the input terminal and providing the stored data on an output;

a first slave latch having first, second and third input terminals for storing data received on one of the input terminals and providing the stored data on an output, the first input terminal coupled to the output of the first initial master latch;

a first secondary master latch coupled to the output of the first slave latch for storing data received from the output of the first slave latch and providing the stored data on an output;

a second input terminal for receiving input data;

a second initial master latch coupled to the second input terminal for storing data received from the input terminal and providing the stored data on an output;

a second slave latch having first, second and third input terminals for storing data received on one of the input terminals and providing the stored data on an output, the first input terminal coupled to the output of the second initial master latch and the second input terminal coupled to the output of the first secondary master latch;

a second secondary master latch coupled to the output of the second slave latch for storing data received from the output of the second slave latch and providing the stored data on an output, the output of the second secondary master latch coupled to the third input terminal of the first slave latch;

a third input terminal for receiving input data;

a third initial master latch coupled to the third input terminal for storing data received from the input terminal and providing the stored data on an output;

a third slave latch having first, second and third input terminals for storing data received on one of the input terminals and providing the stored data on an output, the first input terminal coupled to the output of the third initial master latch and the second input terminal coupled to the output of the second secondary master latch;

a third secondary master latch coupled to the output of the third slave latch for storing data received from the output of the third slave latch and providing the stored data on an output, the output of the third secondary master latch coupled to the third input terminal of the second slave latch;

a fourth input terminal for receiving input data;

a fourth initial master latch coupled to the fourth input terminal for storing data received from the input terminal and providing the stored data on an output;

a fourth slave latch having first, second and third input terminals for storing data received on one of the input terminals and providing the stored data on an output, the first input terminal coupled to the output of the fourth initial master latch, the second input terminal coupled to the output of the third secondary master latch and the third input terminal coupled to the output of the first secondary master latch;

a fourth secondary master latch coupled to the output of the fourth slave latch for storing data received from the output of the fourth slave latch and providing the stored data on an output, the output of the fourth secondary master latch coupled to the third input terminal of the third slave latch and to the second input terminal of the first slave latch;

a clock terminal within each initial master latch for receiving a first clock signal which transfers data from the respective input terminals of each initial master latch to the respective outputs of the initial master latches;

a clock terminal within each secondary master latch for receiving a second clock signal which transfers data from the respective input terminals of each secondary master latch to the respective outputs of the secondary master latches;

a clock terminal within each slave latch for receiving a clock signal which transfers data from one of the respective first, second, and third input terminals of each slave latch to the respective outputs of the slave latches; and a logic circuit coupled to the outputs of each of the slave latches for logic operation based on the state of the data provided on these outputs.

6. The circuit of claim 5 wherein the clock terminal of each slave latch comprises:

a first clock terminal for receiving a clock signal sk which controls the transfer of data from the respective first input terminals of the slave latches to the respective outputs of the slave latches;

a second clock terminal for receiving a clock signal skDn which controls the transfer of data from the respective second input terminals of the slave latches to the respective outputs of the slave latches; and a third clock terminal for receiving a clock signal skUp which controls the transfer of data from the respective third input terminals of the slave latches to the respective outputs of the slave latches.

7. The circuit of claim 6, further including a control circuit for providing a plurality of clock signals.

8. The circuit of claim 7 wherein the control circuit first provides the first clock signal, then provides the second clock signal, and thereafter repeatedly provides a third clock signal followed by a fourth clock signal, the third and fourth clock signals being provided three times each in order to shift the data stored in the slave latches in a downward vertical direction and provide three additional data outputs on the outputs of the slave latches.

9. The circuit of claim 7 wherein the control circuit first provides the first clock signal, then provides the second clock signal, and thereafter provides a third clock signal followed by a fifth clock signal, the third and fifth clock signals and being provided three times each in order to shift the data stored in the slave latches in an upward vertical direction and provide three additional data outputs on the outputs of the slave latches.

10. The circuit of claim 7 wherein each of the slave latches includes additional input terminals coupled to one of the outputs of the secondary master latches and the control circuit provides additional clock signals to each slave latch to control the transfer of data from the additional input terminals to the outputs of the slave latches and allow data stored in the slave latches to be shifted in a predetermined pattern.

11. The circuit of claim 10 wherein the control circuit controls the clock signals so that the master slave combination operates as a counter.

12. The circuit of claim 7 wherein the control circuit controls the plurality of clock signals so that new data may be provided on the input terminals and loaded in a horizontal direction from the respective input terminals to the respective outputs of the initial master latches while data previously loaded in a horizontal direction from the outputs of the respective initial master latches to the respective slave latches is being transferred in a vertical direction among the slave latches.

13. The circuit of claim 7 wherein the control circuit provides the second and third clock signals during the same clock cycle.

14. The circuit of claim 5 wherein the logic circuit comprises a column select circuit which receives the outputs from the slave latches and in response to these outputs addresses specific bit lines coupled to memory cells in a memory array.

15. A method for storing and shifting data, comprising the steps of:

receiving input data on an input terminal;

storing data received on the input terminal in a first master latch circuit, the first master latch circuit providing an output of the data stored in the first master latch circuit;

transferring data from the input terminal to the first master latch circuit under control of a first clock signal;

storing the data provided on the output of the first master latch circuit in a first slave latch circuit which provides an output of the data stored in the first slave latch circuit;

transferring data from the output of the first master latch circuit to the first slave latch circuit under control of a second clock signal;

storing data provided on the output of the first slave latch circuit in a second master latch circuit which provides an output of the data stored in the second master latch circuit;

transferring data from the output of the first slave latch circuit to the second master latch circuit under control of a third clock signal;

storing the data on the output of the second master latch circuit in a second slave latch circuit which provides an output of the data stored in the second slave latch circuit;

transferring data from the output of the second master latch circuit to the second slave latch circuit under control of a fourth clock signal; and performing logic operation in a logic circuit based on the state of the data provided on the outputs of the first slave latch circuit and second slave latch circuit.

16. The method of claim 15, further comprising the steps of:

storing the data on the output of the second master latch circuit in a third slave latch circuit which provides an output of the data stored in the third slave latch circuit; and transferring data from the output of the second master latch circuit to the third slave latch circuit under control of a fifth clock signal.

17. The method of claim 16, further comprising the steps of:

storing the data on the output of the second master latch circuit in a fourth slave latch circuit which provides an output of the data stored in the fourth slave latch circuit;

transferring data from the output of the second master latch circuit to the fourth slave latch circuit under control of a sixth clock signal; and organizing the first, second, third, and fourth slave latch circuits in a vertical column for transferring data vertically among the slave latch circuits.

18. The method of claim 15, further comprising the step of organizing the input terminal, first master latch circuit, first slave latch circuit and second master latch circuit in a horizontal data transfer line for transferring data on a horizontal row.

* * * * *